(12) United States Patent
Rider

(10) Patent No.: US 9,945,939 B1
(45) Date of Patent: Apr. 17, 2018

(54) METHOD FOR DETERMINING A LOCATION OF AN EMITTER

(71) Applicant: LOKDON LLC, Kissimmee, FL (US)

(72) Inventor: Donald Curtis Rider, Orlando, FL (US)

( * ) Notice: Subject to any disclaimer, the term of this patent is extended or adjusted under 35 U.S.C. 154(b) by 835 days.

(21) Appl. No.: 14/268,075

(22) Filed: May 2, 2014

Related U.S. Application Data

(60) Provisional application No. 61/819,828, filed on May 6, 2013.

(51) Int. Cl.
*G01S 11/06* (2006.01)
*G01S 11/14* (2006.01)

(52) U.S. Cl.
CPC ............... *G01S 11/06* (2013.01); *G01S 11/14* (2013.01)

(58) Field of Classification Search
CPC ................................. G01S 11/06; G01S 11/14
USPC ......................................................... 342/351
See application file for complete search history.

(56) References Cited

U.S. PATENT DOCUMENTS

| 4,724,442 | A | * | 2/1988 | King | G01S 3/40 342/434 |
|---|---|---|---|---|---|
| 5,686,942 | A | | 11/1997 | Ball | |
| 7,317,428 | B2 | * | 1/2008 | Bolle | H01Q 3/267 342/368 |
| 7,474,983 | B2 | | 1/2009 | Mazalek | |
| 7,618,323 | B2 | | 11/2009 | Rothschild | |
| 7,627,139 | B2 | | 12/2009 | Marks | |
| 7,737,944 | B2 | | 6/2010 | Harrison | |
| 7,782,297 | B2 | | 8/2010 | Zalewski | |
| 7,850,526 | B2 | | 12/2010 | Zalewski | |
| 7,942,744 | B2 | | 5/2011 | Wells | |
| 8,125,459 | B2 | | 2/2012 | Mattice | |
| 2004/0080415 | A1 | * | 4/2004 | Sorensen | G01V 3/12 340/541 |
| 2006/0258451 | A1 | | 11/2006 | Yang | |
| 2009/0017910 | A1 | | 1/2009 | Rofougaran | |
| 2009/0322582 | A1 | * | 12/2009 | Baugh | G08C 17/02 341/176 |
| 2012/0166135 | A1 | * | 6/2012 | Ing | G01N 29/4472 702/142 |

* cited by examiner

*Primary Examiner* — Frank J McGue
(74) *Attorney, Agent, or Firm* — Dority & Manning, P.A.

(57) ABSTRACT

A method for determining a position of an emitter relative to a plurality of receivers is provided. The method includes emitting first and second signals at the emitter and receiving the first and second signals at each receiver of the plurality of receivers. The method also includes steps for establishing a first detected wave of the second signal as a lost wave or a gained wave for each receiver of the plurality of receivers. Detecting lost and gained waves assists with increasing the accuracy of a calculated location of the emitter relative to the plurality of receivers.

17 Claims, 10 Drawing Sheets

| Wave Number | WaveStart | WaveEnd | WavePeak |
|---|---|---|---|
| 0 | StartTime0 | EndTime0 | PeakTime0 |
| 1 | StartTime1 | EndTime1 | PeakTime1 |
| 2 | StartTime2 | EndTime2 | PeakTime2 |
| 3 | StartTime3 | EndTime3 | PeakTime3 |
| 4 | StartTime4 | EndTime4 | PeakTime4 |
| ... | ... | ... | ... |
| 50 | StartTime50 | EndTime50 | PeakTime50 |

METHOD FOR DETERMINING A LOCATION OF AN EMITTER

PRIORITY CLAIM

This application claims the benefit of previously filed U.S. Provisional Patent Application entitled "MOTION ACTUATED CONTROL SYSTEM AND METHOD," assigned U.S. Ser. No. 61/819,828, filed May 6, 2013, and which is incorporated herein by reference for all purposes.

FIELD OF THE INVENTION

The present subject matter relates generally to emitters, such as radio or ultrasonic emitters, and methods for determining a location of the emitters.

BACKGROUND OF THE INVENTION

Accurately and precisely determining a location of an emitter is useful in various technologies. For example, certain game systems include remote control units. A common type of remote control unit includes: a body which is gripped by a user, buttons, joysticks and/or other user-operable interface elements on the body; and hardware and software which generate and transmit commands corresponding to a user's manipulation of the interface elements to a console of the gaming system. Certain remote control units allow the user to transmit commands to the console by both manually manipulating the interface elements on the remote control unit and moving the remote control unit. Thus, accurately and precisely determining a location of an emitter on the remote control unit can allow a user of the associated gaming system to input commands to the console by moving the remote control unit.

Various obstacles and difficulties can make accurately and precisely determining the location of the emitter difficult. For example, certain methods for determining the location of the emitter rely upon time-of-flight of a pulse from the emitter to a receiver in order to determine the location of the emitter. Typical time-of-flight measurements begin timing from when a first pulse is produced. In systems with a piezoelectric ultrasonic transmitter, the piezoelectric ultrasonic transmitter does not instantly emit an ultrasonic wave upon receiving a command signal and initial waves emitted by the piezoelectric ultrasonic transmitter are generally weaker than later waves emitted by the piezoelectric ultrasonic transmitter due to inertia of the piezoelectric element and mass of attached hardware. Thus, the initial waves produced by the piezoelectric ultrasonic transmitter may not be detected by the receiver. If the receiver misses one or more transmitted waves, the time-of-flight measurement will be overstated.

In addition, piezoelectric ultrasonic transmitters are generally very directional such that emissions from the piezoelectric ultrasonic transmitter are stronger along one direction or axis and significantly weak along other directions. Changing an location or orientation of the piezoelectric ultrasonic transmitter can significantly affect the strength of the emission directed towards the receiver. Thus, weaker emissions from the piezoelectric ultrasonic transmitter may not be detected by the receiver if the location or orientation of the piezoelectric ultrasonic transmitter is changed and the time-of-flight measurement will be negatively affected.

Accordingly, a method for accurately and precisely determining a location of an emitter relative to a plurality of receivers would be useful. In particular, a method for accurately and precisely determining a location of an emitter relative to a plurality of receivers that does not rely upon time-of-flight would be useful.

BRIEF DESCRIPTION OF THE INVENTION

The present subject matter provides a method for determining a position of an emitter relative to a plurality of receivers. The method includes emitting first and second signals at the emitter and receiving the first and second signals at each receiver of the plurality of receivers. The method also includes steps for establishing a first detected wave of the second signal as a lost wave or a gained wave for each receiver of the plurality of receivers. Detecting lost and gained waves assists with increasing the accuracy of a calculated location of the emitter relative to the plurality of receivers. Additional aspects and advantages of the present subject matter will be set forth in part in the following description, or may be apparent from the description, or may be learned through practice of the present subject matter.

In a first exemplary embodiment, a method for determining a position of an emitter relative to a receiver is provided. The method includes emitting a first signal at the emitter, receiving the first signal at the receiver, determining a strength of a first detected wave of the first signal, emitting a second signal at the emitter, receiving the second signal at the receiver, determining a strength of a first detected wave of the second signal and establishing whether the first detected wave of the second signal is a lost wave or a gained wave based at least in part on the strength of the first detected wave of the first signal and the strength of the first detected wave of the second signal.

In a second exemplary embodiment, a method for determining a position of an emitter relative to a plurality of receivers is provided. The method includes emitting a first signal at the emitter, determining an arrival time of the first signal at each receiver of the plurality of receivers and calculating a first set of time differentials. The first set of time differentials includes time differentials between arrival times of the first signal at the plurality of receivers and the arrival time of the first signal at a reference receiver of the plurality of receivers. The method also includes emitting a second signal at the emitter, determining an arrival time of the second signal at each receiver of the plurality of receivers and calculating a second set of time differentials. The second set of time differentials includes time differentials between arrival times of the second signal at the plurality of receivers and the arrival time of the second signal at the reference receiver of the plurality of receivers. The method further includes establishing whether a first detected wave of the first signal is a lost wave or a gained wave for each receiver of the plurality of receivers based at least in part on the first and second sets of time differentials.

In a third exemplary embodiment, a method for determining a position of an emitter relative to a plurality of receivers is provided. The method includes emitting a first signal at the emitter, receiving the first signal at each receiver of the plurality of receivers, emitting a second signal at the emitter, receiving the second signal at each receiver of the plurality of receivers and a step for establishing a first detected wave of the first signal as a lost wave or a gained wave for each receiver of the plurality of receivers.

These and other features, aspects and advantages of the present subject matter will become better understood with reference to the following description and appended claims. The accompanying drawings, which are incorporated in and constitute a part of this specification, illustrate embodiments of the present subject matter and, together with the description, serve to explain the principles of the present subject matter.

BRIEF DESCRIPTION OF THE DRAWINGS

A full and enabling disclosure of the present subject matter, including the best mode thereof, directed to one of ordinary skill in the art, is set forth in the specification, which makes reference to the appended figures.

Like reference numerals refer to like parts throughout the several views of the drawings.

DETAILED DESCRIPTION

Figure 1:
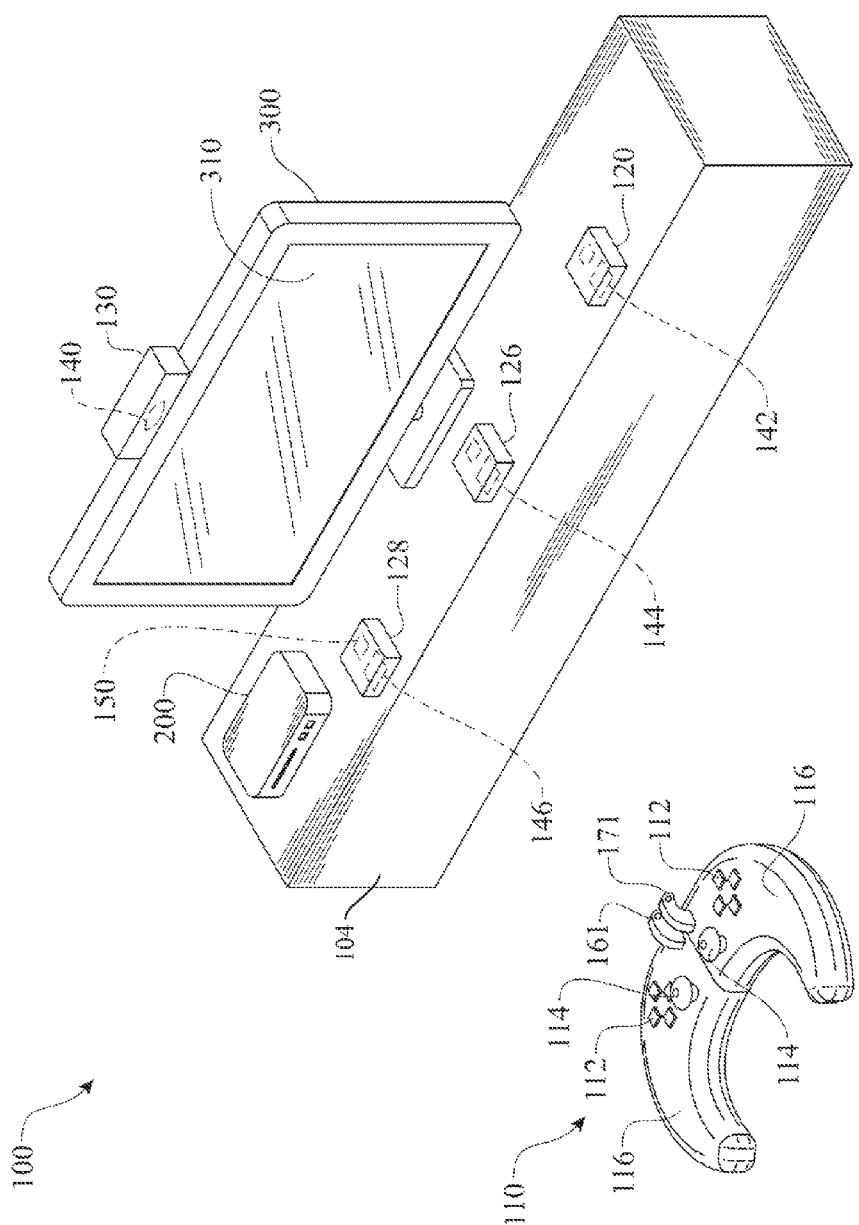
FIG. 1 provides a perspective view of a motion actuated control system according to an exemplary embodiment of the present subject matter.

Reference now will be made in detail to embodiments of the present subject matter, one or more examples of which are illustrated in the drawings. Each example is provided by way of explanation of the present subject matter, not limitation of the present subject matter. In fact, it will be apparent to those skilled in the art that various modifications and variations can be made in the present subject matter without departing from the scope or spirit of the present subject matter. For instance, features illustrated or described as part of one embodiment can be used with another embodiment to yield a still further embodiment. Thus, it is intended that the present subject matter covers such modifications and variations as come within the scope of the appended claims and their equivalents.

For purposes of description herein, the terms "upper", "lower", "left", "rear". "right". "front", "vertical", "horizontal", and derivatives thereof shall relate to the present subject matter as oriented in FIG. 1. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the concepts defined in the appended claims. Hence, specific dimensions and other physical characteristics relating to the embodiments disclosed herein are not to be considered as limiting, unless the claims expressly state otherwise.

Referring initially to FIG. 1, a perspective view of a motion actuated control system 100 according to an exemplary embodiment of the present subject matter is provided. The motion actuated control system 100, hereinafter system 100, includes a game console 200. The game console 200 can be selectively loaded with software that enables the game console 200 to run one of a variety of video game programs, as will be understood by those skilled in the art. A remote control unit 110 and a display monitor 300 having a screen 310 interface with the game console 200 in a manner that will be hereinafter described. In an exemplary application of the system 100, which will be hereinafter described, a user selects and manipulates images and characters presented on the screen 310 of the display monitor 300 as the user plays a video game. The user can selectively position the remote control unit 110 in a variety of orientations to likewise orient the images and characters as they are depicted on the screen 310.

Figure 2:
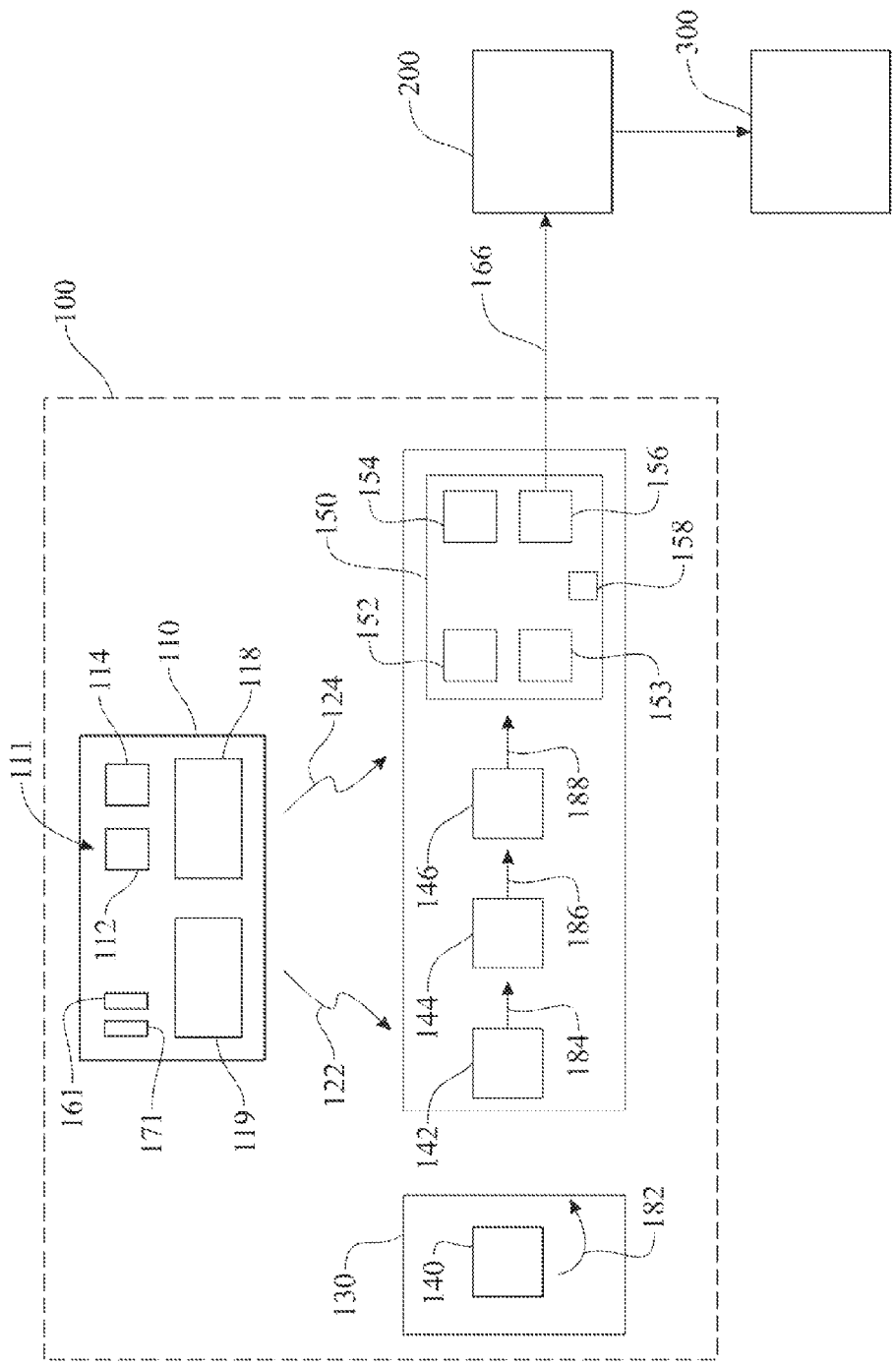
FIG. 2 provides a schematic view of certain components of the exemplary motion actuated control system of FIG. 1.

The remote control unit 110 of the system 100 is designed for manipulation by at least one user (not illustrated) and provides an interface for the user to interact with and select and manipulate game characters in a game, which the game console 200 presents on the screen 310 of the display monitor 300. Accordingly, the remote control unit 110 includes at least one user-operable interface element 111 (FIG. 2). In some embodiments, the remote control unit 110 may be designed to be gripped using one or both hands of the user. The user-operable interface elements 111 include two symmetrical sets of buttons 112 and joysticks 114 which can be selectively manipulated by the user's thumbs as the user grips the remote control unit 110. In some embodiments the remote control unit 110 includes a pair of symmetrical gripping areas 116 which the user can grasp with his or her hands.

As further illustrated in FIG. 1, in some embodiments, the game console 200, the display monitor 300 and other components of the system 100 may be provided on a suitable support 104. The support 104 includes furniture such as a stand, cabinet, table, chest of drawers or the like or any other generally elongated structure that is suitable for supporting the components of the system 100.

Figure 3:
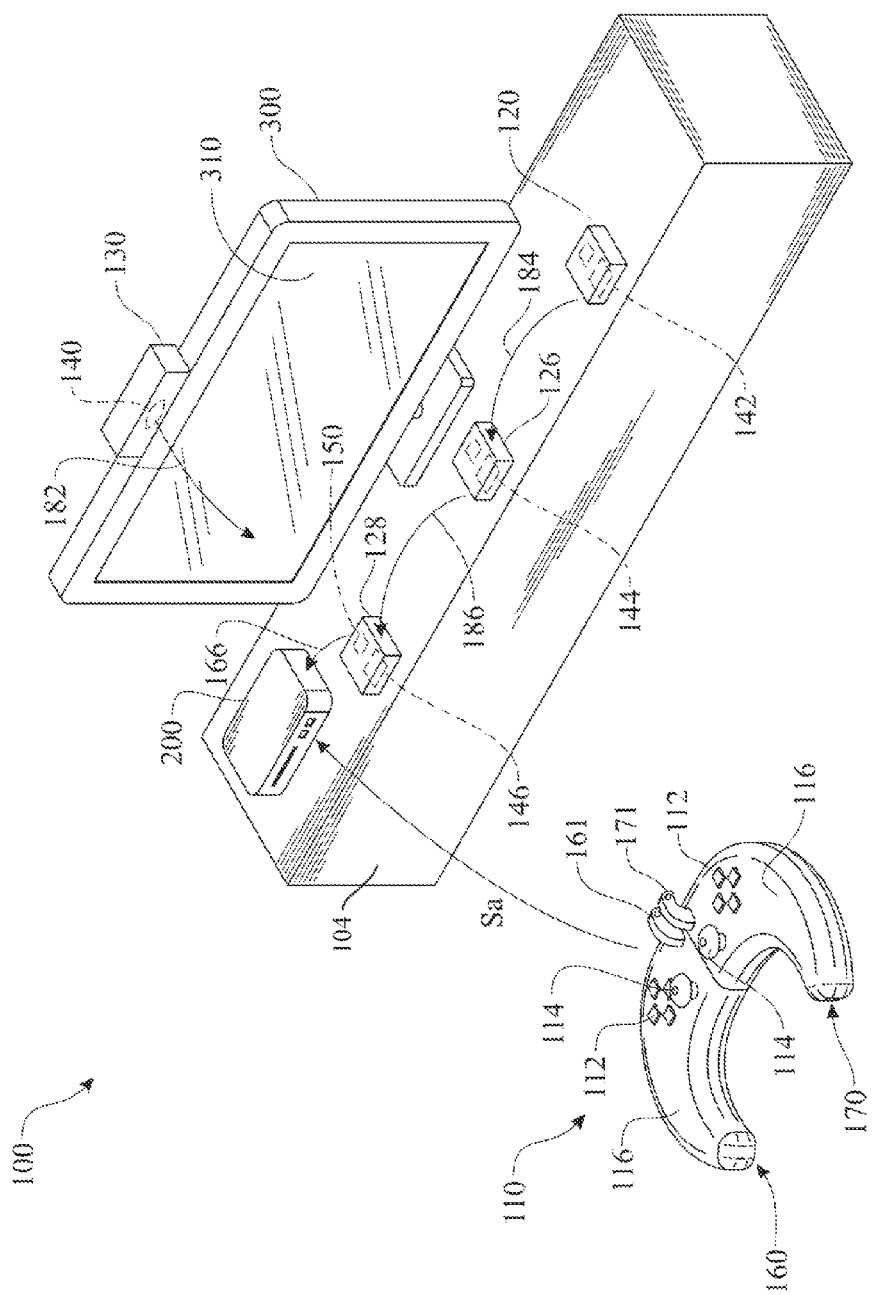
FIG. 3 provides a perspective view of the exemplary motion actuated control system of FIG. 1 in a first operational mode.
Figure 4:
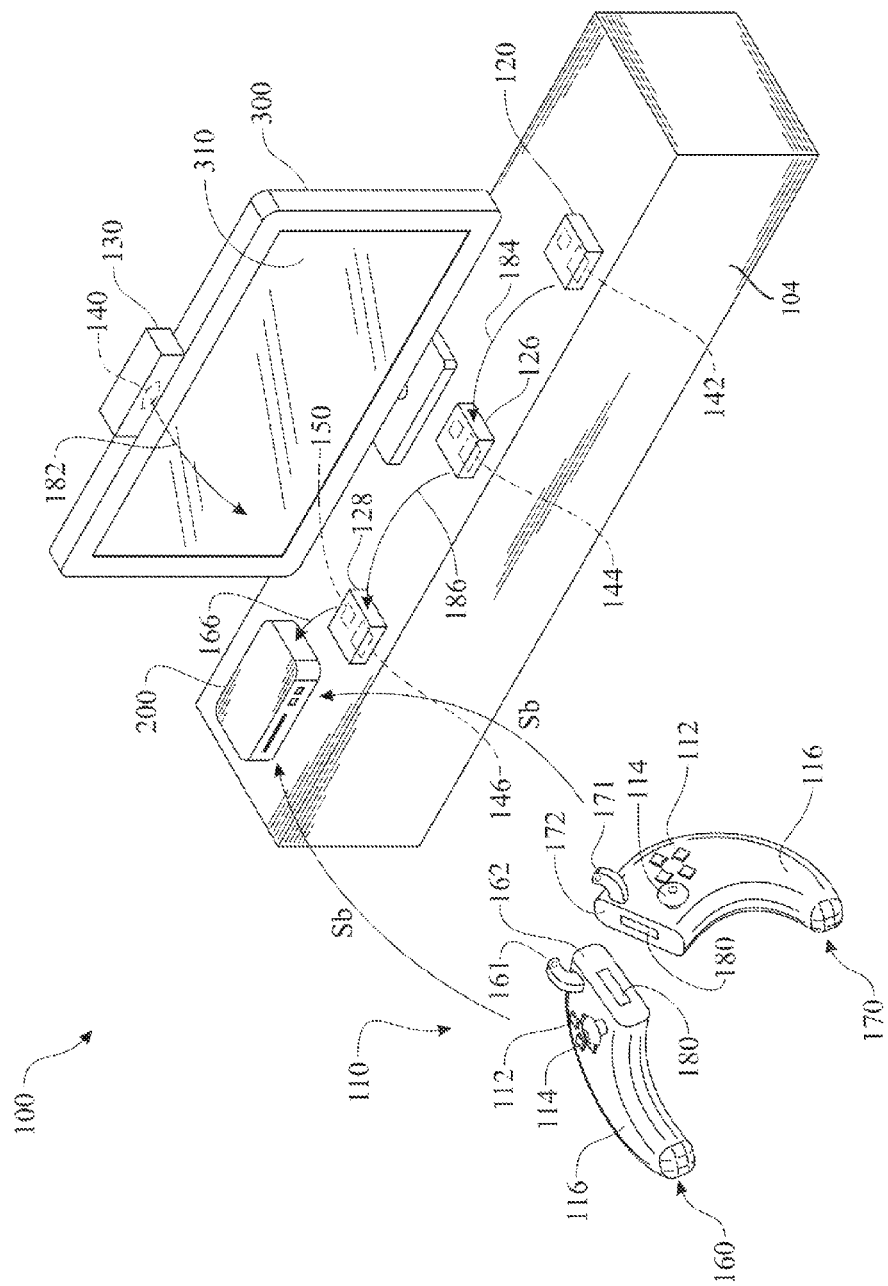
FIG. 4 provides a perspective view of the exemplary motion actuated control system of FIG. 1 in a second operational mode.

FIG. 2 provides a schematic view of certain components of motion actuated control system 100. As may be seen in FIG. 2, remote control unit 110 includes a command signal transmitter 118, which is adapted to transmit command signals 124 responsive to the user's manipulation of the user-operable interface element 111. The remote control unit 110 further includes at least one ultrasonic transducer 161, 171 which is adapted to locate the remote control unit 110 in three-dimensional space. The remote control unit 110 includes at least one reference signal transmitter 119, which interfaces with the ultrasonic transducer(s) 161, 171 and is adapted to transmit reference signals 122 that are used to calculate the spatial position of the remote control unit 110 as will be hereinafter described. As illustrated in FIGS. 1, 3 and 4, the ultrasonic transducer(s) 161, 171 may be provided on the exterior front of the remote control unit 110.

Turning back to FIG. 1, the system 100 further includes a right lower receiver box 120, a middle lower receiver box 126, a left lower receiver box 128, and an upper receiver box 130. The upper receiver box 130 includes an upper reference signal receiver 140. The right lower receiver box 120 includes a right reference signal receiver 142. The middle lower receiver box 126 includes a middle reference signal receiver 144, which interfaces with the right reference signal receiver 142. The left lower receiver box 128 includes a left reference signal receiver 146 that interfaces with the middle reference signal receiver 144. The left lower receiver box 128 further includes a processing unit 150, which interfaces with the left reference signal receiver 146. As illustrated in FIG. 2, the processing unit 150 includes a command signal receiver 152, a positioning signal receiver 153, a computational module 154, a command transmitter 156 and a data storage module 158.

Figure 5:
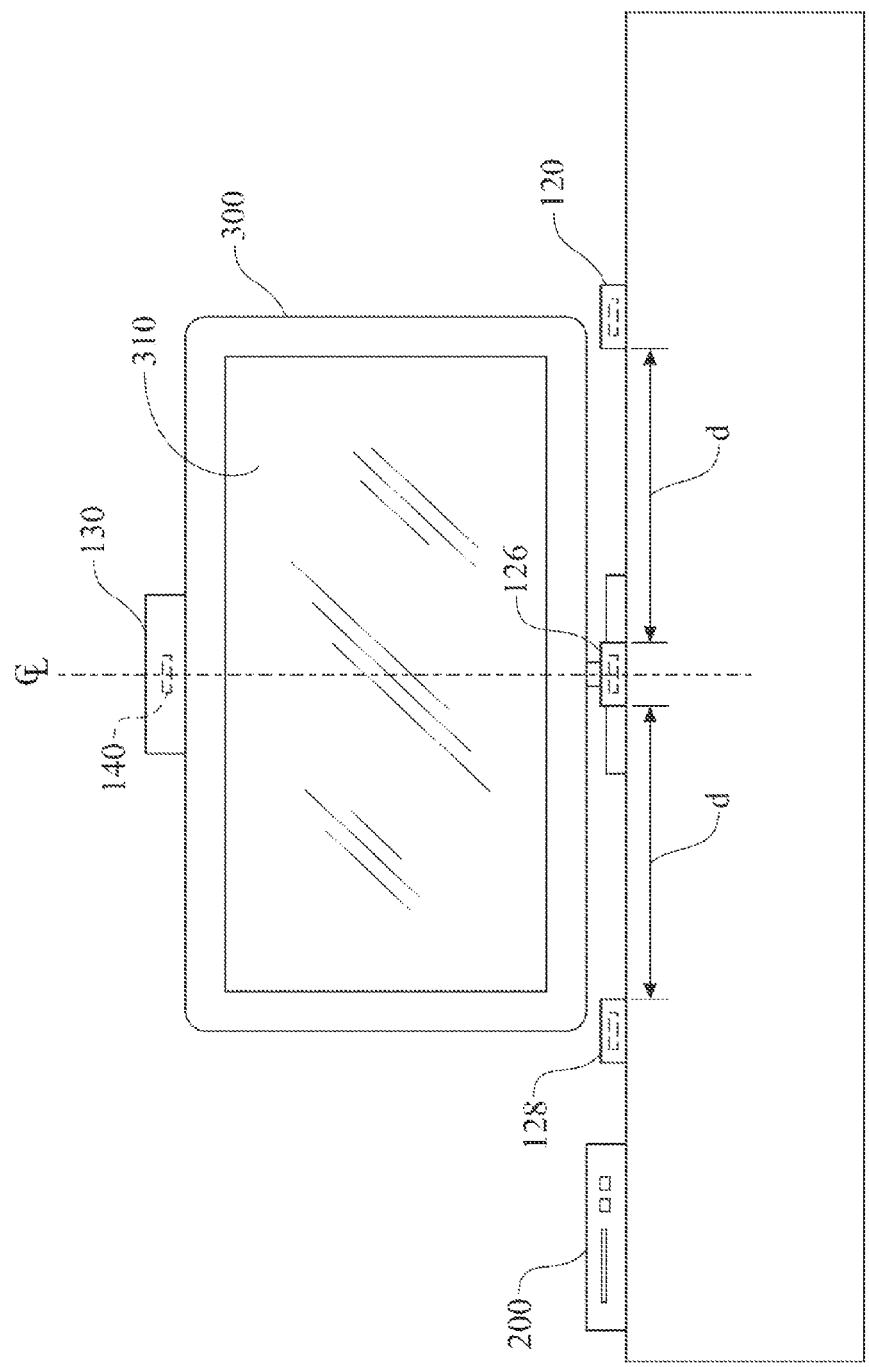
FIG. 5 provides a front elevation view of certain components of the exemplary motion actuated control system of FIG. 1.

Referring again to FIG. 1 of the drawings, in an exemplary arrangement of the components of the system 100, the upper receiver box 130 (which includes the upper reference signal receiver 140) may be provided on the display monitor 300. The right lower receiver box 120 may be provided on the support 104 in front of the display monitor 300. The middle reference signal receiver 144 of the right lower receiver box 120 is positioned substantially in alignment with the upper reference signal receiver 140 of the upper receiver box 130. The right reference signal receiver 142 and the left reference signal receiver 146 of the right lower receiver box 120 are positioned to the left and right sides of, respectively, and substantially equidistant to the middle reference signal receiver 144, as shown in FIG. 5.

In operation of the system 100, which will be hereinafter described, the action commands 166 which are transmitted to the game console 200 may originate according to two different pathways. According to the first pathway, the action commands 166 may be generated when the user manipulates a user-operable interface element 111, such as depression of a button 112 or shifting of a joystick 114 on the remote control unit 110. User manipulation of one or more of the user-operable interface elements 111 causes the command signal transmitter 118 to transmit one or more command signals 124 to the command signal receiver 152 of the processing unit 150. The computational module 154 processes the command signals 124 and generates the corresponding action commands 166, which are then transmitted to the game console 200 via the command transmitter 156. In response, the game console 200 controls the movements of game characters on the screen 310 of the display monitor 300. The movements of the characters on the screen 310 correspond in real time to the manipulations that the user imparts to the user operable interface elements 111.

According to the second pathway, the action commands 166 may be generated when motion-detection software, which supports the computational module 154 of the processing unit 150, detects spatial movement of the remote control unit 110 via input from the ultrasonic transducer(s) 161, 171. The reference signal transmitter 119 of the remote control unit 110 transmits reference signals 122 to the upper reference signal receiver 140, the right reference signal receiver 142, the middle reference signal receiver 144 and the left reference signal receiver 146. The upper reference signal receiver 140 transmits an upper positioning signal 182 to the processing unit 150. The right reference signal receiver 142, the middle reference signal receiver 144 and the left reference signal receiver 146 transmit a right positioning signal 184, a middle positioning signal 186 and a left positioning signal 188, respectively, to the processing unit 150. The positioning signals 182, 184, 186, 188 are transmitted to the computational module 154 via the positioning signal receiver 153.

The data storage module 158 loads a specific action command profile to the computational module 154. The action command profile is a definable set of motion definitions in which predefined three-dimensional positions and/or movements of the remote control unit 110 are mapped to action commands 166 equal to those capable of being generated by operations exerted on the user-operable interface element 111, for the particular game that is being executed in the game console 200. The computational module 154 then converts the positioning signals 182, 184, 186, 188 to at least one three-dimensional measurement of position and/or movement (e.g., spatial position coordinates, speed vector coordinates and/or acceleration vector coordinates, or location data points). Three-dimensional measurements may be calculated in relation to an origin point, and may, for instance, be in the form of Cartesian (x, y, z) coordinates. The computational module 154 then analyzes the location data points and derives velocity and acceleration data therefrom, and determines whether three-dimensional measurement of position and or/movement is present in the loaded action command profile, i.e., is provided with a mapped game command or action commands 166. If a one or more mapped game commands 166 are found and matched with the x, y, z location data points which correspond to the three-dimensional positions and/or movements of the remote control unit 110, the computational module 154 then causes the command transmitter 156 to transmit the mapped game commands 166 to the game console 200.

In some embodiments, the data points may be mapped to an analog control stick on the remote control unit 110 through a mapping algorithm to allow a user to aim during playing of a video game by moving the left remote control unit portion 160 and/or the right remote control unit portion 170. The computational module 154 may "move" the analog sticks so that the game screen presented on the display monitor 300 would affect the view expected from the x, y, z spatial movements of the remote control unit 110.

As an example, the remote control unit 110 includes a button 112 in the shape of a rightward-pointing arrow. The action command profile includes mapping information in which detection of rightward movement of the remote control unit 110 over a distance that is greater than a predefined distance is considered equivalent to pressing the rightward arrow button. Identical game commands 166 will therefore be transmitted from the remote control unit 110 to the game console 200 in the event that the user presses the rightward-pointing arrow button or in the event that the user moves the remote control unit 110 to the right over a distance, which is greater than the predefined distance.

In some embodiments, the system 100 may be selectively operable in a static mode in which the video user operates the user-operable interface elements 111 of the remote control unit 110 or a dynamic mode in which the user spatially moves the remote control unit 110 to manipulate the movements and actions of game characters which appear on the display monitor 300. In both modes, equally formatted action commands 166 may be transmitted from the processing unit 150 to the game console 200. The game console 200 may not differentiate between action commands 166 which correspond to the static mode and action commands 166 which correspond to the dynamic mode of operation.

In some embodiments, the data storage module 158 may be adapted to store various action command profiles. The computational module 154 may be capable of selecting an active action command profile from the data storage module 158 and loading the selected action command profile responsive to the reference signals 122 or the command signals 124. This facility enables game-specific customization of the processing unit 150 in generation of action commands 166 that correspond to manipulation of the user-operable interface elements 111 as appropriate for each game. The active action command profiles can be easily changed for different games. Storage of various action command profiles in the data storage module 158 may render the system 100 applicable to any type of game as long as a compatible action command profile is stored in the data storage module 158. Therefore, the system 100 facilitates motion control compatibility with virtually any video game on the market.

The processing unit 150 may be provided with one or more hardware/software interfaces to render the system 100 compatible with any conventional game console, PC or other electronic device or equipment that is capable of running game programs. No modification of the conventional electronic device or the game software in the device may be required to render the game motion-controllable via spatial motion of the remote control unit 110. A plug-and-play configuration may be used in which the user sets up the system 100 and chooses the action command profile for a particular game to render the game motion-controllable.

In some embodiments, the system 100 may be configured such that the user-operable interface elements 111 can be used in the static mode in combination with spatial motion of the remote control unit 110 in the dynamic mode to control the actions and movements of the game characters on the display monitor 300. In some embodiments, the system 100 may be configured such that the user-operable interface elements 111 can be rendered inoperable while the remote control unit 110 is operated in the dynamic mode, and vice-versa.

As illustrated in FIG. 1, the system 100 includes at least one upper reference signal receiver 140 which may be placed on the display monitor 300 and at least one lower reference signal receiver 142, 144, 146 which may be placed generally below the display monitor 300. However, other configurations for the reference signal receivers may be possible.

In some embodiments, the processing unit 150 and the right reference signal receiver 142, the middle reference signal receiver 144 and the left reference signal receiver 146 may be provided in a common or different structures such as the right lower receiver box 120 which may be placed on the support 104 generally in front of the display monitor 300. The upper reference signal receiver 140 may be provided in the upper receiver box 130 with the middle reference signal receiver 144 in the right lower receiver box 120 disposed in alignment with the upper reference signal receiver 140 and the right reference signal receiver 142 and the left reference signal receiver 146 on opposite sides of and equidistant to the middle reference signal receiver 144, as shown in FIG. 5. This arrangement of the reference signal receivers may provide for optimum performance of the system 100, although alternative configurations and arrangements of the reference signal receivers may be possible in alternative embodiments.

In various embodiments, the command signal transmitter 118 and the reference signal transmitter 119 of the remote control unit 110 includes a single transmitter or, alternatively, two separate transmitters as shown in FIG. 2. Similarly, the command signal receiver 152 and the positioning signal receiver 153 of the processing unit 150 may be a single receiver or two separate receivers, as illustrated. Whether the transmitters 118, 119 and the receivers 152, 153 are combined or separate may depend on whether the reference signals 122 and the command signals 124 can be processed by the same hardware, for example and without limitation. In various embodiments, each transmitter-receiver connection within the remote control unit 110 and also between the remote control unit 110 and the game console 200 may be wired or wireless.

In some embodiments, the command signal transmitter 118, the reference signal transmitter 119 and the reference signal receivers 140, 142, 144, 146 may operate using ultrasound transmission and reception, respectively. Accordingly, ultrasonic reference signals 122 may be transmitted from the reference signal transmitter 119 of the remote control unit 110 to each reference signal receiver 140, 142, 144, 146. A transducer (not illustrated) in each reference signal receiver 140, 142, 144, 146 may convert the received ultrasonic reference signal 122 into electric positioning signals 182, 184, 186, 188 that are transmitted to the processing unit 150. The computational module 154 measures the time of arrival of each electric positioning signal 182, 184, 186, 188 and uses that parameter to calculate the positions from which the ultrasonic reference signals 122 were transmitted, corresponding to the spatial positions of the remote control unit 110. Other three-dimensional values such as a velocity vector and an acceleration vector may be calculated, if necessary, and the method of obtaining the corresponding mapped action commands 166, if any, is performed.

In some embodiments, the ultrasonic transducer(s) 161, 171 of the remote control unit 110 may be omni-directional, allowing for a correct signal reception at the reference signal receivers 140, 142, 144, 146 independently of the relative spatial position of the remote control unit 110 with respect to the reference signal receivers 140, 142, 144, 146. This expedient may render unnecessary the requirement of pointing the remote control unit 110 towards the reference signal receivers 140, 142, 144, 146 or placing the remote control unit 110 in any particular position for the system 100 to function properly.

In some embodiments, the ultrasonic reference signal transmitter 119 of the remote control unit 110 may interface with a left omni-directional ultrasonic transducer 161 and a right omni-directional ultrasonic transducer 171 placed in face-to-face relationship to each other to render the omni-directional functionality of the ultrasonic reference signal transmitter 119.

In some embodiments, the ultrasonic reference signal receivers 140, 142, 144, 146 includes an adjustable high-gain amplifier (not illustrated) such that the gain of each reference signal receiver 140, 142, 144, 146 may be varied. To allow for adjustment, the high-gain amplifier may, for example and without limitation, include a digital potentiometer (not illustrated), which is capable of being adjusted by the processing unit 150. Thus, the signal level of the positioning signals 182, 184, 186, 188 transmitted from the reference signal receivers 140, 142, 144, 146 to the processing unit 150 may be controlled and maintained at adequate levels.

Referring next to FIGS. 3 and 4 of the drawings, in some embodiments, the remote control unit 110 includes a left remote control unit portion 160 and a right remote control unit portion 170, which are selectively detachable from each other. The left remote control unit portion 160 and the right remote control unit portion 170 may each be provided with its corresponding left ultrasonic transducer 161 and right ultrasonic transducer 171 which locate the corresponding left remote control unit portion 160 and right remote control unit portion 170 in three-dimensional space. The left remote control unit portion 160 and the right remote control unit portion 170 can each also include a corresponding reference signal transmitter 119, which transmits a corresponding reference signal 122 to the reference signal receivers 140, 142, 144 and 146. This feature may allow use of the remote control unit 110 in an attached configuration in which the left remote control unit portion 160 and the right remote control unit portion 170 are attached to each other and a detached configuration in which the left remote control unit portion 160 and the right remote control unit portion 170 are detached from each other. In the detached configuration, the left remote control unit portion 160 and the right remote control unit portion 170 may transmit independent reference signals 122, as noted above; therefore, the positions of the left remote control unit portion 160 and the right remote control unit portion 170 can be determined independently of each other via the reference signal transmitters 119 and the processing unit 150.

In some embodiments, the left remote control unit portion 160 and the right remote control unit portion 170 may be adapted to be gripped by the respective left and right hands of the video user. Each of the left remote control unit portion 160 and the right remote control unit portion 170 includes at least one user-operable interface element 111.

A non-limiting example of use of the exemplary remote control unit 110 in the detached configuration is illustrated in FIG. 4. While grasping the left remote control unit portion 160 with the left hand, the user (not illustrated) stretches his or her left arm forward. The processing unit 150 detects the forward motion of the left remote control unit portion 160. The computational module 154 of the processing unit 150 calculates the total displacement of the left remote control unit portion 160 and the direction of displacement, and compares the distance and direction of displacement with the predetermined mapped distances and directions of displacement that are stored in the action command profile in the data storage module 158. The computational module 154 interprets the displacement as a motion that corresponds to shooting an arrow from a bow. Accordingly, the processing unit 150 transmits an action command 166 that corresponds to the shooting of a bow to the game console 200. The game console 200 causes a game character that is displayed on the display monitor 300 to aim and shoot an arrow from a bow. The user can cause the game character presented on the display monitor 300 to aim the bow by moving his or her left arm up and down or left and right such that the computational module 154 selects and transmits the corresponding mapped aiming game commands 166 to the game console 200. The game character presented on the display monitor 300 then aims the bow as simulated by the user.

In some embodiments, the left remote control unit portion 160 and the right remote control unit portion 170 may be selectively attachable to each other such as via a pair of magnets 180 on the respective portions 160, 170. The magnets 180 secure opposing surfaces 162, 172 on the respective left and rights remote control unit portions 160, 170 in contact with each other when the left remote control unit portion 160 and the right remote control unit portion 170 are attached. It will be recognized and understood that alternative attachment techniques known by those skilled in the art may be used to detachably attach the left remote control unit portion 160 and the right remote control unit portion 170 in other embodiments.

In some embodiments, the left remote control unit portion 160 and the right remote control unit portion 170 of the remote control unit 110 includes sensor units (not illustrated) that detect whether the left remote control unit portion 160 and the right remote control unit portion 170 are in the attached or detached configuration. The command signal transmitter 118 of the remote control unit 110 may be capable of signaling the processing unit 150 when the left remote control unit portion 160 and the right remote control unit portion 170 are attached or detached. In the event that the sensor units detect that the left remote control unit portion 160 and the right remote control unit portion 170 are attached, the processing unit 150 may not perform a position or motion analysis of the remote control unit 110. The processing unit 150 may accordingly transmit to the game console 200 action commands 166 which correspond to the command signals 124 that originate in the command signal transmitter 118 of the remote control unit 110 by the video user's manipulation of the user operable interface elements 111. On the other hand, in the event that the sensor units detect that the left remote control unit portion 160 and the right remote control unit portion 170 are detached, the processing unit 150 may perform a spatial position and/or motion analysis of the remote control unit 110, as illustrated in FIG. 4. The processing unit 150 may accordingly transmit to the game console 200 action commands 166 which correspond to the reference signals 122 that originate in the reference signal transmitter 119 of the remote control unit 110 via input from the left ultrasonic transducer 161 and the right ultrasonic transducer 171. Use of the remote control unit 110 thus may become intuitive for the user as the user may associate the attached left remote control unit portion 160 and right remote control unit portion 170 with "classic" manual operation of the remote control unit 110 and may associate the detached left remote control unit portion 160 and right remote control unit portion 170 with motion control operation of the remote control unit 110. Thus, the system 100 may appeal to both users who prefer motion-controlled movement of game characters and users who prefer manual control of game characters. Furthermore, the system 100 may be optimal for single users who may not wish to operate the system 100 in the motion control operational mode.

For example and without limitation, in some embodiments, in the event that the sensor units detect that the left remote control unit portion 160 and the right remote control unit portion 170 are detached, the reference signal transmitters 119 of the respective left remote control unit portion 160 and the right remote control unit portion 170, via input from the respective left ultrasonic transducer 161 and right ultrasonic transducer 171, may transmit reference signals 122 to the positioning signal receiver 153 of the processing unit 150 via the reference signal receivers 140, 142, 144, 146. Accordingly, the computational module 154 of the processing unit 150 performs position and/or motion analysis of the remote control unit 110 and actuates the positions and movements of the characters, which are presented on the display monitor 300 via the positions, and movements of the remote control unit 110. In the event that the sensor units detect that the left remote control unit portion 160 and the right remote control unit portion 170 are attached to each other, the reference signal transmitters 119 of the left remote control unit portion 160 and the right remote control unit portion 170 may terminate transmission of the reference signals 122 to the positioning signal receiver 153. The command signal transmitter 118 of the remote control unit 110 transmits command signals 124 to the positioning signal receiver 153 of the processing unit 150. Accordingly, the computational module 154 of the processing unit 150 actuates the positions and movements of the characters, which are presented on the display monitor 300 via manual user input from the user operable, interface elements 111.

In some embodiments, in the event that the sensor units detect attachment or detachment of the left remote control unit portion 160 and right remote control unit portion 170, the command signal transmitter 118 or the reference signal transmitter 119 of the remote control unit 110 may transmit a change-of-status signal to the computational module 154 of the processing unit 150. Accordingly, in the event of detachment of the left remote control unit portion 160 and right remote control unit portion 170, the computational module 154 of the processing unit 150 may initiate a position and/or motion analysis of the remote control unit 110 using the reference signals 122 as input data. On the other hand, in the event of attachment of the left remote control unit portion 160 and right remote control unit portion 170, the computational module 154 of the processing unit 150 may terminate any position and/or motion analysis of the reference signals 122 which it may be in the process of performing.

In some embodiments, in the event that the computational module 154 of the processing unit 150 detects detachment of the left remote control unit portion 160 and right remote control unit portion 170, any initial result of a position and/or motion analysis carried out on the remote control unit 110 may be stored in the data storage module 158 of the processing unit 150. The stored initial result may be used as an origination point for any further position and/or motion analysis that is subsequently carried out. This expedient may enable the system 100 to solve positioning problems which may be caused by different users playing the video game at different heights of two remote control units 110, a user's playing the game in various postures (for example standing or sitting) or by the user's playing the game at varying distances from the display monitor 300. This "relative" positioning system may be transparent to the user, as it is triggered by detachment of the left remote control unit portion 160 and right remote control unit portion 170. Alternatively, the user may force the processing unit 150 to store a new point of origin by, for instance, operating on a specific user-operable interface element on the remote control unit 110 or moving the remote control unit 110 in a predefined manner.

Exemplary embodiments of the system 100 may also provide a preferable method for detecting the position of the remote control unit 110 with respect to the right lower receiver box 120 and the upper receiver box 130. The method includes the following steps: the ultrasonic transducer(s) 161, 171 sense the spatial position of the remote control unit 110 and transmit this information to the reference signal transmitter 119; the reference signal transmitter 119 in the remote control unit 110 transmits reference signals 122 in form of ultrasound wave bursts; the reference signal receivers 140, 142, 144, 146 receive the ultrasound wave burst reference signals 122 and, by means of internal transducers (not illustrated), convert the reference signals 122 into the electrical positioning signals 182, 184, 186, 188. In turn, the electrical positioning signals 182, 184, 186, 188 may be transmitted to the computational module 154 of the processing unit 150. The computational module 154 may detect the middle-positioning signal 186 that is emitted by the middle reference signal receiver 144 and measure the time in which the wave burst of the middle positioning signal 186 was detected. The computational module 154 may then calculate the time of transmission of the reference signal 122 to each of the upper reference signal receiver 140, the right reference signal receiver 142, the middle reference signal receiver 144 and the left reference signal receiver 146 as the difference between a known transmission starting time and the time in which the middle positioning signal 186 was detected. Once the different transmission times to each reference signal receiver 140, 142, 144, 146 are known, the computational module 154 may calculate the spatial position of the remote control unit 110 and proceed with further motion-control calculations and mapping of the game commands 166. Performance of the motion-control calculations by measuring the time of arrival of the middle-positioning signal 186 may provide a precise calculation of the final position of the remote control unit 110. This may be due to several factors. First, the ultrasound wave signal may be more consistent in the middle area. Second, unlike at the beginning of the ultrasound burst, in the middle area of the ultrasound burst the movement of the ultrasound transducer element in the reference signal receivers 140, 142, 144, 146 is already synchronized with the arriving ultrasound reference signal 122 burst, therefore reducing measurement errors due to lack of transducer synchronization.

Exemplary embodiments of the disclosure are directed to a method for detecting the position of a device provided with an ultrasound wave transmitter that transmits ultrasound wave bursts. The method includes receiving a wave burst in a receiver; detecting a middle portion of the wave burst and measuring the time in which the middle portion of the wave burst has been detected; calculating the time of transmission of the wave burst as the difference between a known transmission starting time and the time in which the middle area of the wave burst has been detected. This method can be applied for detecting the position of a device belonging to a gaming application, or of any other applicable device. The method has delivered positional accuracies of within a few hundredths of an inch, or, if applied to the electronic gaming field, within a few pixels on the screen 310. It also does not require averaging of the calculated positions to filter randomly deviated results; on the contrary, the method's response is instant and accurate. Movements of a small fraction of an inch are visible.

When applied to the electronic gaming field, this results in the user feeling an immediate and precise response of his movements on the screen 310. Precision is so high that, if the remote control unit 110 is held perfectly still, the successively calculated three-dimensional positions bounce only a few hundredths of an inch, which is extremely better than the ¼-inch (or greater) bouncing values observed in conventional motion-controlled gaming systems. In practice, it has been observed that if the user holds an arm outstretched the movement of the remote control unit 110 due to the user's breathing can be appreciated on screen 310. If the user is moving the remote control unit 110 to aim at an object in the game, aiming movements of as little as a fraction of an inch will be visible on the screen 310. This is useful for many games where precise aiming is crucial for game play.

The net result of these advantageous effects is that the user feels a very good connection with the game and the gaming experience is boosted.

Various alternatives to the technical features shown in the figures are possible. For example, the present subject matter contemplates a remote control unit comprising a main body including two separable parts, each part comprising a reference signal transmitter capable of transmitting reference signals to be used for further position and/or motion analysis in a processing unit of any kind, comprised in whatever motion-controlled electronic device. In another example, the method of detecting if the separable parts of a remote control unit are detached or attached, and respectively performing or not performing a position and/or motion analysis in a processing system is applicable to a processing system of any kind, comprised in whatever motion-controlled electronic device. Similarly, the method for detection of an ultrasound wave based on detecting a middle portion of the wave could be applied in various applications in which ultrasound waves are used to determine the position of an object.

The processing unit 150 may have the capability to track the location of the remote control unit 110 with a positional accuracy of within a few hundredths of an inch. No sample averaging is needed so the response is instant and accurate— there is no response lag. Movements of a small fraction of an inch are visible on the display monitor 300. For example, if a user holds an arm outstretched while holding the remote control unit 110, movement induced by the user's breathing can be seen on the display monitor 300. If the remote control unit 110 is held perfectly still, the location "bounce" from measurement errors is only a few hundredths of an inch. This results in immediate and exact response that is several orders of magnitude better than conventional game systems.

If a user is using the motion control feature to aim during a video game, movements of a fraction of an inch are enough to see a result. This is important for many games where precise aiming is crucial for game play. A definable game profile may be loaded into the data storage module 158 of the processing unit 150. This game profile includes definitions used by software to map physical movements made by the user to controller button presses and analog stick movements by manipulation of the user operable interface element 111. This feature may allow the remote control unit 110 to be easily customized for each game so that it produces controller output (button presses and analog stick movements) appropriate for the different games. Multiple game profiles may be stored within the data storage module 158 of the processing unit 150 and can be easily changed if the user chooses to play a different game. Therefore, the remote control unit 110 can be used with any game; even though a game may have been written 15 year ago, for example, without motion capture capability, the remote control unit 110 allows motion capture to be added to the games.

Multiple game hardware interfaces are easily constructed so the system 100 can not only work with any game but also with any game console. The same system 100 can work with all three platforms—the Wii®, the Xbox360®, and the PS3®. Even older platforms can be easily connected to the system 100 and used.

It will be appreciated by those skilled in the art that no modification of the system 100 or the game software which is used by the system 100 is required to use conventional game systems. The user plugs in the controller, chooses the game profile and now the game has motion control.

The system 100 may use a time of arrival tracking algorithm in which a transducer sends out a burst of sound waves and multiple receivers in different locations record the time of arrival. With the difference in arrival times at the multiple receivers, the source location can be derived. Time differentials between the receivers 140, 142, 144, 146 must be established consistently and accurately. Any unwanted variation in the signals due to measurement errors may be magnified by the math required to find (x,y,z). Conventional methods may use the time of the first ultrasonic wave which is received by the receiver as the arrival time. This may result in an accuracy of about +/− a quarter of an inch due to some limitations of the transducer transmitter and receiver elements. Given the same signal twice in a row, the first sample may be off by a ¼ inch or more from the previous even though the transmitting element hasn't moved. For this reason, ultrasonic ranging may not be optimal for accurate motion capture for the following reasons:

1. The transmitter transducer responds slowly at the start of the signal pulse and doesn't deliver a full power wave for 6-8 waves. The leading edge of the transmitted wave, then, is not well defined.
2. The receivers also are slow to respond due to the mass of the receiver elements. This results in some unknown number of waves passing the receiver before the element moves enough to generate a positive response visible to system 100. This makes it impossible to see the leading edge of the transmitter's wave burst. The wave that is first visible is not the first transmitted so there is a built-in error measuring time of arrival.
3. The receivers begin vibrating with a time lag behind the sound wave and gradually come up to speed. It can take 6-12 waves before the receiver element is moving in time with the sound wave passing it. This results in the perceived signal having a higher frequency and time delay at the start of the wave burst and gradually syncing up after a while. This time lag can introduce an error into the arrival times if the first wave is used. This is enough to vary the final (x,y,z) locations by a half inch or more.
4. At many places the first wave visible to the receiver is barely above the triggering threshold of the electronics. Due to sampling variations this wave may be barely visible in one sample and not visible in the next. This causes the recorded arrival time to bounce back and forth between two values randomly. This in turn causes the derived (x,y,z) location to bounce back and forth an inch or so even though the transmitter element has not moved.
5. Ultrasonic transducers are very directional. Quality of the signal is good on-axis but varies dramatically off axis. If the transducer is turned tracking away from the receiver the information quality degrades very quickly. This in turn produces (x, y, z) information that is not accurate.

The system 100 of the disclosure may utilize a software algorithm that determines time of arrival using sound waves from the middle portion of a wave burst. Here, the signal is much more consistent and the movement of the receiver element is synced up with the sound wave. The beginning and ending parts of the signal wave burst are inaccurate and are ignored. The determination of which part of the signal for each of the four receivers 140, 142, 144, 146 should be used is a very complex algorithm. Without it, the (x, y, z) information returned may be inaccurate and have a lot of "bounce" in the results.

In some embodiments, issue no. 5 above may be solved using a face-to-face arrangement of two ultrasonic transducers in the remote control unit 110. The net result is that the (x, y, z) coordinates that are received match extremely close to the actual position of the remote control unit 110. If the remote control unit 110 isn't moving, the display on game console 200 may have a "bounce" of only a few pixels. This may be desirable for game play, as it establishes the connection "feel" between the user and the game.

The face-to-face arrangement of the ultrasonic transducers in the remote control unit 110 may be desirable to obtain an omnidirectional signal. The software that evaluates the receiver signals to produce the (x, y, z) data location points of the left remote control unit portion 160 and the right remote control unit portion 170 may produce consistent position and motion results of within a couple of hundredths of an inch with no "bounce" or response delay. The method is sufficiently accurate that averaging of position and motion data points is not necessary. The software which the computational module 154 uses to interpret the (x, y, z) data location points may convert the data location points into a set of discrete, labeled movements even though the movement of the user can be varied from one user to another. These motions may then be mapped directly to a button press or a series of button presses corresponding to manipulation of the user operable interface element 111.

In some embodiments, the software which is utilized by the computational module 154 may utilize an algorithm that can take the (x, y, z) data location point information and convert it into movements of the analog sticks of the remote control unit 110. The software may produce exactly the analog stick movements which are necessary to lock the screen 310 view to the (x,y) location of the remote control unit 110. The result is that the screen 310 on the display monitor 300 is locked exactly with the movements of the remote control unit 110 to the degree that a user can aim at a point on the screen 310 within a few pixels of the desired target with no bouncing at all. Fabrication of the remote control unit 110 in the left remote control unit portion 160 and the right remote control unit portion 170 may have several advantages:

1. When it is assembled, the remote control unit 110 responds just like a normal controller and all motion control is turned off. This allows a user to play a game in its original form. Many users dislike the motion capture offerings of conventional gaming systems because they are forced to always use the motion capture. Game play works with or without the motion capture capability at the discretion of the user. The system 100 of the disclosure may offer the option of using motion capture without requiring it. When the remote control unit 110 is separated into the left remote control unit portion 160 and the right remote control unit portion 170, the motion control is turned on and all the special features of motion control are enabled. The user operable interface element 111 may remain functional whether or not the system 100 is in motion capture mode.
2. The system 100 may match (x, y, z) coordinates of the user's motion to target (x, y, z) coordinates to perform actions. For example, if a user extends his or her left arm straight out in front, such positioning of the left arm may be interpreted as shooting a bow. The system 100 then accesses the game menu, arms the user with a bow and switches to a mode in which the (x, y, z) coordinates are mapped into the analog control stick of the remote control unit 110. The user can aim by moving the left arm up and down or left and right. The aiming point on the screen 310 moves exactly with the user's movement. When the remote control unit 110 is separated into the left remote control unit portion 160 and the right remote control unit portion 170, the (x, y, z) point where it is separated may be saved as an "Origin Point." Coordinates for matching to target (x, y, z) coordinates may be established relative to this Origin Point. This feature may enable one set of (x, y, z) target points to work no matter whether the user is sitting or standing.
3. The capability of separating the remote control unit 110 into the left remote control unit portion 160 and the right remote control unit portion 170 may allow encoding of numerous motions since the hands of the user move independently of each other.

It will be appreciated by those skilled in the art that the method used with the ultrasonic transducers 161, 171 of the reference signal transmitter 119 may alternatively be used with a radio frequency signal. This expedient may facilitate tracking of many, many more remote control units 110 simultaneously and could be used in any system requiring immediate (x, y, z) location data points:

1. Full body motion capture for movie animation;
2. Helmet tracking for VR stereo goggles; and
3. Combining #1 and #2 (above) for full body VR.

In short, any application that requires immediate and accurate location of another object in (x,y,z) space may utilize the method of the disclosure. It will be appreciated by those skilled in the art that a variety of alternative arrangements for the receivers 140, 142, 144, 146 are possible. These alternative receiver arrangements may alter the algebra which is required to find the (x,y,z) location data points.

It will be recognized and understood that alternative designs for the ultrasonic transducers 161, 171 of the system 100 are possible. For example and without limitation, the same method may be carried out using an RF signal rather than ultrasonic waves. Time of arrival measurements may be performed without specialized software algorithms at greatly reduced accuracy. Averaging many samples may somewhat improve results while adding a significant response lag.

Figure 6:
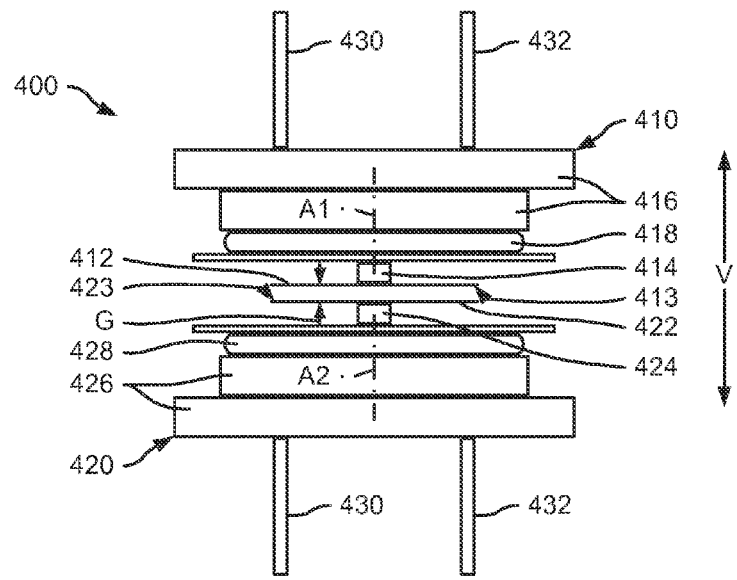
FIG. 6 provides a front elevation view of an ultrasonic emitter according to an exemplary embodiment of the present subject matter.

FIG. 6 provides a front elevation view of an ultrasonic emitter 400 according to an exemplary embodiment of the present subject matter. Ultrasonic emitter 400 may be used for any suitable purpose. For example, ultrasonic emitter 400 may be used in system 100 (FIG. 1) as one of ultrasonic transducers 161, 171. Ultrasonic emitter 400 is operable to generate or emit ultrasonic waves. In particular, ultrasonic emitter 400 includes features for generating or emitting substantially omnidirectional ultrasonic waves, as discussed in greater detail below.

As may be seen in FIG. 6, ultrasonic emitter 400 includes a first ultrasonic transducer 410 and a second ultrasonic transducer 420. First ultrasonic transducer 410 includes a plate 412 with an outer surface 413. Plate 412 may be constructed of or with any suitable material. For example, plate 412 may be constructed of or with a metal, such as aluminum or steel. Plate 412 is coupled, e.g., mounted, to a piezoelectric element 414. As will be understood by those skilled in the art, piezoelectric element 414 deforms along a first axis of deformation or vibration A1 when a voltage is applied across piezoelectric element 414. Thus, piezoelectric element 414 expands or contracts when a voltage is applied across piezoelectric element 414 depending upon the polarity of the voltage applied across piezoelectric element 414. First ultrasonic transducer 410 also includes support structures 416, such as plastic plates or blocks, for supporting or bearing movable elements of first ultrasonic transducer 410. An elastic element 418 also supports movable elements of first ultrasonic transducer 410. For example, elastic element 418 may extend between and couple movable elements of first ultrasonic transducer 410 and support structures 416. Thus, elastic element 418 permits movement of piezoelectric element 414 relative to support structures 416, e.g., that are static or fixed.

Second ultrasonic transducer 420 also includes a plate 422 with an outer surface 423, a piezoelectric element 424, support structures 426 and an elastic element 428, e.g., that are the same or substantially similar to corresponding components of first ultrasonic transducer 410. As may be seen in FIG. 6, plate 412 of first ultrasonic transducer 410 faces plate 422 of second ultrasonic transducer 420 such that plate 412 of first ultrasonic transducer 410 is spaced apart from plate 422 of second ultrasonic transducer 420 by a gap, G. The gap G may have any suitable size. For example, the gap G may be less than ten millimeters and greater than a tenth of a millimeter. Thus, plate 412 of first ultrasonic transducer 410 is spaced apart from plate 422 of second ultrasonic transducer 420 by less than ten millimeters and greater than a tenth of a millimeter. It should be understood that ultrasonic emitter 400 may include a fixed plate (similar to plate 422) that faces plate 412 of first ultrasonic transducer 410 to define the gap G. Thus, ultrasonic emitter 400 need not include second ultrasonic transducer 420 in alternative exemplary embodiments.

Plate 412 of first ultrasonic transducer 410 is also aligned with plate 422 of second ultrasonic transducer 420 across the gap G. Thus, the axis of deformation or vibration A1 of first ultrasonic transducer 410 may be parallel to (e.g., and coaxial with) an axis of deformation or vibration A2 of second ultrasonic transducer 420. Outer surface 413 of plate 412 of first ultrasonic transducer 410 may also be substantially parallel to outer surface 423 of plate 422 of second ultrasonic transducer 420. In addition, outer surface 413 of plate 412 of first ultrasonic transducer 410 and outer surface 423 of plate 422 of second ultrasonic transducer 420 may be substantially perpendicular to a vertical direction V, e.g., such that the gap G is in a horizontal plane.

The position and orientation of elements of first ultrasonic transducer 410 relative to elements of second ultrasonic transducer 420 may assist with generating or emitting substantially omnidirectional ultrasonic waves. For example, first ultrasonic transducer 410 and second ultrasonic transducer 420 are wired such that supplying a positive current to first and second ultrasonic transducers 410, 420 will drive plates 412, 414 towards each other and supplying a negative current to first and second ultrasonic transducers 410, 420 will pull plates 412, 414 apart. By switching the polarity of current supplied to first and second ultrasonic transducers 410, 420, air within the gap G is compressed between plates 412, 414. The compressed air exits the gap G and produces an ultrasonic sound wave that expands omnidirectionally, e.g., in a plane that is perpendicular to the vertical direction V or one of the axes of deformation or vibration A1, A2. The edge effect at plates 412, 414 can also assist with dispersing the ultrasonic sound wave along the vertical direction V. By generating or emitting substantially omnidirectional ultrasonic waves, the effect of the orientation or position of ultrasonic emitter 400 is reduced. As an example, a strength of the ultrasonic waves directed towards reference signal receivers 140, 142, 144, 146 may be less affected by the orientation or position ultrasonic emitter 400, and a user of ultrasonic emitter 400 need not keep or maintain ultrasonic emitter 400 in a particular orientation or position in order to direct ultrasonic waves towards reference signal receivers 140, 142, 144, 146.

Figure 7:
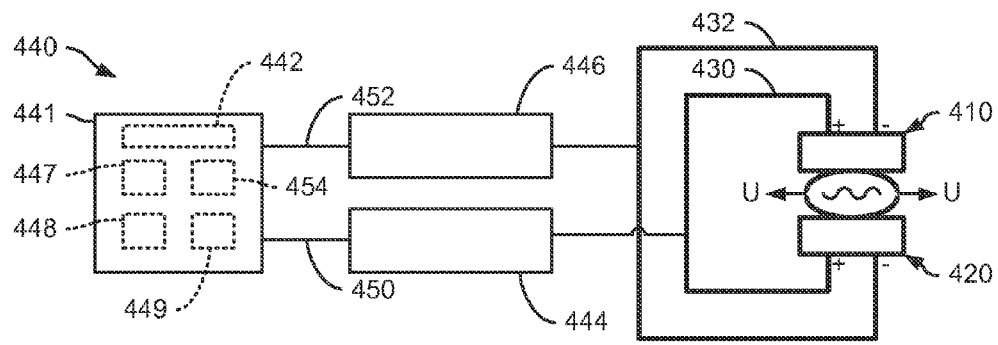
FIG. 7 provides a schematic view of the exemplary ultrasonic emitter of FIG. 6 and a driving unit of the exemplary ultrasonic emitter.

FIG. 7 provides a schematic view of ultrasonic emitter 400 and a driving unit 440 for ultrasonic emitter 400. As may be seen in FIG. 7, a first lead 430 extends between and connects positive terminals of first and second ultrasonic transducers 410, 420. Similarly, a second lead 432 extends between and connects negative terminals of first and second ultrasonic transducers 410, 420.

Driving unit 440 includes a driving controller 441 with an associated power supply 442. Driving controller 441 includes one or more processors 448 and a memory 449. The processor(s) 448 may be any suitable processing device, such as a microprocessor, microcontroller, integrated circuit, or other suitable processing device. As an example, the processor(s) 448 may be a Parallax Propeller processor. The memory 449 may include any suitable storage media, including, but not limited to, non-transitory computer-readable media, RAM, ROM, hard drives, flash drives, accessible databases, or other memory devices. The memory 449 can store information accessible by processor(s) 448, including instructions 447 that can be executed by processor(s) 448 to control and/or operate various components of ultrasonic emitter 400 to provide emitter functionality.

Driving controller 441 is in operative communication a first voltage switching unit 444 and a second voltage switching unit 446. First voltage switching unit 444 is coupled or connected to first lead 430, and second voltage switching unit 446 is coupled or connected to second lead 432, as discussed in greater detail below. Thus, driving controller 441 is configured to selectively operate first and second voltage switching units 444, 446 in order to drive piezoelectric elements 414, 424 of first and second ultrasonic transducers 410, 420.

Driving controller 441 includes two output pins. A first pin 450 may correspond to a "positive signal" and a second pin 452 may correspond to a "negative signal." A status or output of first and second pins 450, 452 may be changed or modified by driving controller 441. In particular, the status of first and second pins 450, 452 may selective adjusted by driving controller 441 between a grounded state and a powered state (e.g., connect or coupled to power supply 442).

First pin 450 is coupled or connected to first voltage switching unit 444, and second pin 452 is coupled or connected to second voltage switching unit 446. First voltage switching unit 444 may have an output of zero volts when first pin 450 is in the grounded state and any suitable voltage (e.g., up to thirty volts) when first pin 450 is in the powered state. Similarly, second voltage switching unit 446 may have an output of zero volts when second pin 452 is in the grounded state and any suitable voltage (e.g., up to thirty volts) when second pin 452 is in the powered state.

Driving controller 441 includes an emitter control module 454. Driving controller 441 may implement emitter control module in order to operate ultrasonic emitter 400. It will be appreciated that the term "module" refers to computer logic utilized to provide desired functionality. Thus, a module can be implemented in hardware, application specific circuits, firmware and/or software controlling a general purpose processor. In one embodiment, modules are program code files stored on the storage device, loaded into memory and executed by a processor or can be provided from computer program products, for example computer executable instructions, that are stored in a tangible computer-readable storage medium such as RAM, hard disk or optical or magnetic media.

To generate or emit ultrasonic waves (shown with arrows U) with ultrasonic emitter 400, emitter control module 454 is implanted. When no ultrasonic waves U are desired, driving controller 441 adjusts the status of first and second pins 450, 452 to the grounded state. With both first and second pins 450, 452 in the grounded state, the potential across piezoelectric elements 414, 424 of first and second ultrasonic transducers 410, 420 is zero. For the positive side of the ultrasonic waves U, driving controller 441 adjusts the status of first pin 450 to the powered state and the status of second pin 452 to the grounded state such that the potential across piezoelectric elements 414, 424 of first and second ultrasonic transducers 410, 420 is not zero. For the negative side of the ultrasonic waves U, driving controller 441 adjusts the status of first pin 450 to the grounded state and the status of second pin 452 to the powered state such that the potential across piezoelectric elements 414, 424 of first and second ultrasonic transducers 410, 420 is not zero. Between the positive and negative sides of the ultrasonic waves U, driving controller 441 adjusts the status of first and second pins 450, 452 to the grounded state. Thus, the total potential across piezoelectric elements 414, 424 of first and second ultrasonic transducers 410, 420 may be twice the voltage of power supply 442 between the positive and negative sides of the ultrasonic waves U.

Ultrasonic waves U may be generated or emitted in a group or burst of TransmitWaves, e.g., at 40 kHz. Thus, driving controller 441 may be operated such that ultrasonic emitter 400 emits a wave group of TransmitWaves. TransmitWaves may have any suitable size. For example, TransmitWaves may be at least thirty waves.

Ultrasonic waves U may be generated or emitted such that there is an interval or space between sequential wave groups. Thus, driving controller 441 may be operated such that ultrasonic emitter 400 waits for a period of SamplesPerSecond between sequential wave groups. The SamplesPerSecond may be any suitable interval or frequency. For example, SamplesPerSecond may be greater than fifteen Hertz and less than twenty Hertz. Thus, driving controller 441 may be operated such that a time interval of $$\frac{1}{SamplesPerSecond}$$

is provided between a first wave group from ultrasonic emitter 400 and a second, later wave group from ultrasonic emitter 400.

Emitter control module 454 may be implemented such that first and second ultrasonic transducers 410, 420 are overdriven. In particular, power supply 442 may be sized or configured such that a power supplied to piezoelectric element 414 of first ultrasonic transducer 410 via first voltage switching unit 444 when first pin 450 is in the powered state is selected such that piezoelectric element 414 of first ultrasonic transducer 410 vibrates at a maximum amplitude (e.g., to a maximum mechanical limit) after less than ten reciprocations (or less than five reciprocations) of piezoelectric element 414 of first ultrasonic transducer 410. Second ultrasonic transducer 420 may be similarly driven by power supply 442 via second voltage switching unit 446 when second pin 452 is in the powered state.

As an example, a voltage across piezoelectric element 414 of first ultrasonic transducer 410 when first pin 450 is in the powered state may be significantly greater than a maximum suggested voltage for first ultrasonic transducer 410. In particular, the voltage across piezoelectric element 414 of first ultrasonic transducer 410 when first pin 450 is in the powered state may be at least two times, at least three times, at least four times or at least five times greater than the maximum suggested voltage for first ultrasonic transducer 410. The voltage across piezoelectric element 424 of second ultrasonic transducer 420 may also be significantly greater than a maximum suggested voltage for second ultrasonic transducer 420 when second pin 452 is in the powered state. By overdriving first and second ultrasonic transducers 410, 420 in such a manner, piezoelectric elements 414, 424 of first and second ultrasonic transducers 410, 420 may be quickly driven to a desired amplitude of vibration within a small number of vibrations of piezoelectric elements 414, 424 of first and second ultrasonic transducers 410, 420.

Figure 8:
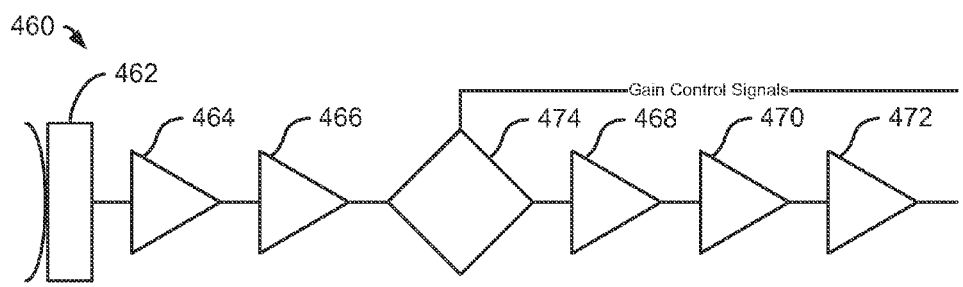
FIG. 8 provides a schematic view of a tracking controller and ultrasonic receiver according to an exemplary embodiment of the present subject matter.

FIG. 8 provides a schematic view of an ultrasonic receiver 460 according to an exemplary embodiment of the present subject matter. Ultrasonic receiver 460 may be used for any suitable purpose. For example, ultrasonic receiver 460 may be used in system 100 (FIG. 1) as one of reference signal receivers 140, 142, 144, 146. Ultrasonic receiver 460 is configured to receive and detect ultrasonic waves, e.g., from ultrasonic emitter 400.

As may be seen in FIG. 8, ultrasonic receiver 460 includes a piezoelectric receiver 462. An output signal from piezoelectric receiver 462 is amplified through a five-stage amplifier. Five discrete, e.g., transistor, amplifiers (a first amplifier 464, a second amplifier 466, a third amplifier 468, a fourth amplifier 470 and fifth amplifier 472) may be used rather than operational amplifiers to improve response time. A, e.g., digital, potentiometer 474 is disposed between second amplifier 466 and third amplifier 468. Potentiometer 474 is adjustable, e.g., with a tracking controller 500 (FIG. 9), in order to independently change a sensitivity of ultrasonic receiver 460, as will be understood by those skilled in the art. As an example, the signal from piezoelectric receiver 462 may be amplified with the five amplifiers significantly past the point of clipping in order to produce a square wave that will be evaluated by a logical input pin of a remote microprocessor, as discussed in greater detail below. Ultrasonic receiver 460 may be shielded against outside electronic noise, e.g., within a grounded metal housing or cage.

Figures 9, 10:
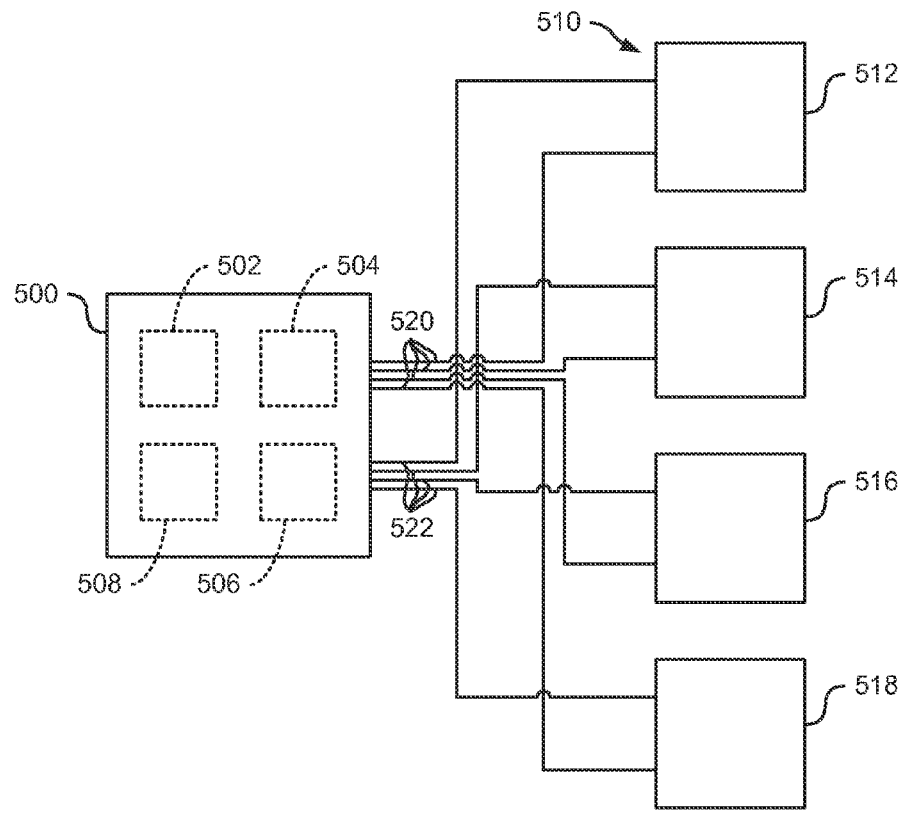
FIG. 9 provides a schematic view of an ultrasonic receiver array according to an exemplary embodiment of the present subject matter.
FIG. 10 illustrates a wave table according to an exemplary embodiment of the present subject matter.

FIG. 9 provides a schematic view of a tracking controller 500 and ultrasonic receiver array 510 according to an exemplary embodiment of the present subject matter. Tracking controller 500 includes one or more processors 502 and a memory 504. The processor(s) 502 may be any suitable processing device, such as a microprocessor, microcontroller, integrated circuit, or other suitable processing device. As an example, the processor(s) 502 may be a Parallax Propeller processor. The memory 504 may include any suitable storage media, including, but not limited to, non-transitory computer-readable media, RAM, ROM, hard drives, flash drives, accessible databases, or other memory devices. The memory 504 can store information accessible by processor(s) 502, including instructions 506 that can be executed by processor(s) 502 to locate an emitter, such as ultrasonic emitter 400 via ultrasonic waves U from ultrasonic emitter 400. In addition, tracking controller 500 may implement an emitter locating module 508.

Ultrasonic receiver array 510 includes four receivers, e.g., in order to permit location of the emitter within three dimensions (x,y,z). Ultrasonic receiver array 510 includes a first receiver 512, a second receiver 514, a third receiver 516 and a reference receiver 518. Reference receiver 518, second receiver 514 and third receiver 516 may be arranged in a straight line, e.g., immediately below a television screen, and first receiver 512 may be arranged, e.g., immediately above the television screen. Thus, ultrasonic receiver array 510 may be disposed in a similar manner to reference signal receivers 140, 142, 144, 146 (FIG. 1). In particular, as may be seen in FIG. 14, second receiver 514 may be positioned ReceiverSpacing left of reference receiver 518 at the same height as reference receiver 518. Third receiver 516 may be positioned ReceiverSpacing right of reference receiver 518 at the same height as reference receiver 518. First receiver 512 is positioned ReceiverHeight directly above reference receiver 518. Thus, first receiver 512, second receiver 514 and reference receiver 518 may form a first right angle, and first receiver 512, third receiver 516 and reference receiver 518 may form a second right angle. ReceiverSpacing and ReceiverHeight may be any suitable lengths.

Signals from each of first receiver 512, second receiver 514, third receiver 516 and reference receiver 518 may be amplified (e.g., with amplifiers of ultrasonic receiver 460) such that the signals are clipped and the resulting square wave may be evaluated as a digital logic signal (zero voltage=binary 0, positive voltage=binary 1) by tracking controller 500. Output signals from each of first receiver 512, second receiver 514, third receiver 516 and reference receiver 518 are connected directly to input pins of tracking controller 500 with output leads 520. Thus, when any of first receiver 512, second receiver 514, third receiver 516 or reference receiver 518 detects an ultrasonic wave, a signal may be transmitted to tracking controller 500 via a respective one of output leads 520. Gain control signals from tracking controller 500 may be transmitted to each of first receiver 512, second receiver 514, third receiver 516 and reference receiver 518 via control leads 522. Thus, a sensitivity of each of first receiver 512, second receiver 514, third receiver 516 and reference receiver 518 may be adjusted by tracking controller 500, e.g., via associated digital potentiometers.

The output signals from each of first receiver 512, second receiver 514, third receiver 516 and reference receiver 518 may be recorded, e.g., in memory 504, of tracking controller 500. In addition, tracking controller 500 may also validate the output signals and calculate the (e.g., x,y,z) location of an associated emitter from the output signals. As an example, tracking controller 500 may execute or implement emitter locating module 508 to determine the location of the associated emitter. An exemplary method for determining the location of an emitter is discussed in greater detail below. It should be understood that tracking controller 500 may be programmed or configured to implement the exemplary method described below. In particular, emitter locating module 508 of tracking controller 500 may be configured to determine the location of an emitter.

The exemplary method described below is described below in the context of ultrasonic emitter 400 (FIG. 6), driving controller 441 (FIG. 7), tracking controller 500 (FIG. 9) and ultrasonic receiver array 510 (FIG. 9). However, it should be understood that the present subject matter may be used with any suitable emitter and receiver combination. For example, the present subject matter may be used radio emitters and receivers, optical emitters and receivers, etc. Thus, the present subject matter is not limited to any particular transmission medium and mechanism and may be used to determine the location of any suitable type of emitter that generates a periodic signal. Also, while described as a particular sequence of steps, it should be understood that the steps of the exemplary method described below may be performed in any other suitable sequence in alternative exemplary embodiments.

As a first step, a period of time is provided in order to wait for clear air. In particular, tracking controller 500 may monitor ultrasonic receiver array 510 and wait for a period of time to elapse in which first receiver 512, second receiver 514, third receiver 516 and reference receiver 518 detect no ultrasonic waves U. Waiting for clear air permits echoes from any previous sampling periods to fade or taper off. Thus, tracking controller 500 may monitor first receiver 512, second receiver 514, third receiver 516 and reference receiver 518 and waits for a time of ClearAirTime to elapse with no activity on any of first receiver 512, second receiver 514, third receiver 516 and reference receiver 518. ClearAirTime may be any suitable time interval. For example, ClearAirTime may be greater than five milliseconds and less than twenty milliseconds.

As a next step, driving controller 441 may operate ultrasonic emitter 400 to generate ultrasonic waves U, e.g., in the manner described above. The ultrasonic waves U from ultrasonic emitter 400 may strike or impact ultrasonic receiver array 510. As described in greater detail below, the location of ultrasonic emitter 400, e.g., relative to ultrasonic receiver array 510 is determined utilizing the arrival times of the ultrasonic waves U from ultrasonic emitter 400 at each first receiver 512, second receiver 514, third receiver 516 and reference receiver 518.

FIG. 10 illustrates a wave table 530 according to an exemplary embodiment of the present subject matter. As may be seen in FIG. 10, wave table 530 includes a WaveStart value, a WaveEnd value and a WavePeak value for each ultrasonic wave received at the respective receiver of ultrasonic receiver array 510. Thus, after ultrasonic emitter 400 emits the ultrasonic waves U, a wave table 530 of sampled wave data is maintained for each receiver of ultrasonic receiver array 510. Tracking controller 500 may establish or generate wave tables 530, e.g., within memory 504 of tracking controller 500. Tracking controller 500 may include an internal counter (not shown), e.g., that runs constantly at eighty megahertz. The internal counter may be used as a time stamp for recording sampled values.

Tracking controller 500 records up to SampleSize waves within wave table 530. SampleSize may be any suitable number of samples. For example, SampleSize may be at least fifty samples.

As an example, at each instance when tracking controller 500 detects an output from one of first receiver 512, second receiver 514, third receiver 516 and reference receiver 518 change from zero volts to a positive voltage, a current time stamp value (e.g., the internal counter) is recorded as a WaveStart entry in a respective wave table 530. When tracking controller 500 detects the output from one of first receiver 512, second receiver 514, third receiver 516 and reference receiver 518 change from the positive voltage to zero volts, the current time stamp value (e.g., the internal counter) is recorded as a WaveEnd entry in the respective wave table 530.

As the signal may have been amplified to a clipped square wave, a peak value of ultrasonic wave U may not be visible to tracking controller 500. However, as ultrasonic waves U are generally symmetrical, a peak time value for each wave of ultrasonic waves U can be calculated with the following:

$$WavePeak = \frac{WaveStart + WaveEnd}{2}$$

The calculated WavePeak value may be saved in the WavePeak entry of WaveTable 530. In such a manner, wave table 530 may be populated with WaveStart entries, WaveEnd entries and WavePeak entries. The process may be repeated until SampleSize entries have been recorded for all receivers of ultrasonic receiver array 510.

As a next step, wave table 530 is validated and a suitable wave packet is found within wave table 530. For example, tracking controller 500 may record a WaveOffset value for each receiver of ultrasonic receiver array 510. The WaveOffset value corresponds to the wave number in wave table 530 that will be used for timing data. The wave table 530 for each receiver of ultrasonic receiver array 510 may be run through multiple tests and each test may modify the associated WaveOffset value. The tests may change the WaveOffset value for all receivers of ultrasonic receiver array 510 together or for a single receiver of ultrasonic receiver array 510. Thus, each receiver of ultrasonic receiver array 510 may have a different WaveOffset value.

As will be understood by those skilled in the art, a piezoelectric element begins vibrating when sound waves strike the piezoelectric element. Due to the mass and resonance of the piezoelectric element, the initial waves will appear slightly delayed relative to the passing sound wave. As the piezoelectric element gains momentum the signal from the piezoelectric element becomes more synchronized with the sound waves. Thus, the signal reported from the piezoelectric element often appears to have a shorter wavelength for the initial waves of the sound waves that changes to the expected wavelength as the sound wave grows stronger and the piezoelectric element gains momentum. The initial waves with shorter wavelengths may be less desirable for determining the wave timing data.

To avoid the initial shorter wavelength waves, tracking controller 500 may perform or implement a CheckPeakTolerance test to compare a wave length of each wave within wave table 530 to a reference value. Thus, for each wave in wave table 530, a wavelength may be determined with the following:

$$WaveLength_{WaveNumber} = WavePeak_{WaveNumber-1} - WavePeak_{WaveNumber}$$

The CheckPeakTolerance test looks for the first wave number within the wave tables 530 for each receiver of ultrasonic receiver array 510 where the $WaveLength_{WaveNumber}$ value is within a WaveTolerancePercent of an expected wave length. WaveOffset is set to point at this wave number. As an example, for a forty kilohertz sound wave, the expected wave length value would be 25 microseconds. WaveTolerancePercent may be any suitable percentage. For example, the WaveTolerancePercent may be three percent, five percent, ten percent, etc.

Tracking controller 500 may also perform or implement a FindWavePacket test to locate a series of waves within wave table 530 with stable values. In the FindWavePacket test, a "wave packet" corresponds to a series of waves within wave table 530 that is WavePacketSize waves long where all waves in the wave packet have a wave length within WaveTolerancePercent of the expected wave length. The FindWavePacket test begins with the current WaveOffset value, testing this wave number and the WavePacketSize waves that follow for each receiver of ultrasonic receiver array 510. If any of the tested waves tested has a wave length that is not within WaveTolerancePercent of the expected wave length, then the test has not found a good wave packet. The WaveOffset is incremented for each receiver of ultrasonic receiver array 510 and another iteration of the FindWavePacket test is performed. WavePacketSize may be any suitable number of waves. For example. WavePacketSize may be five waves, ten waves, twenty waves, etc.

Once the location of the wave packet has been established within wave tables 530 for each receiver of ultrasonic receiver array 510, tracking controller 500 establishes an ArrivalTime for each receiver of ultrasonic receiver array 510, e.g., using one or more waves in the wave packet. Any suitable method may be used to establish the arrival time of the waves in the wave packet at the receivers of ultrasonic receiver array 510. For example, a BestWaveFirstMethod uses the WavePeak time value for the first wave in the wave packet as the ArrivalTime of the signal at the associated receiver. A BestWaveMiddleMethod uses the WavePeak time value for wave number (WavePacketSize/2) as the ArrivalTime of the signal at the associated receiver. A BestWaveLastMethod uses the WavePeak time value for wave number (WavePacketSize−1) as the ArrivalTime of the signal at the associated receiver. A BestWaveAverageMethod averages the values for all WavePeak time values for all waves in the wave packet for the ArrivalTime of the signal at the associated receiver.

Whatever the method used, the ArrivalTime for each receiver of ultrasonic receiver array 510 is established. In particular, an $ArrivalTime_o$ for reference receiver 518, an $ArrivalTime_x$ for third receiver 516, an $ArrivalTime_y$ for first receiver 512 and an $ArrivalTime_z$ for second receiver 514 may be established. From $ArrivalTime_o$, $ArrivalTime_x$, $ArrivalTime_y$, and $ArrivalTime_z$ three time differential values are calculated with the following:

$$T_a = ArrivalTime_x - ArrivalTime_o$$

$$T_b = ArrivalTime_y - ArrivalTime_o$$

$$T_c = ArrivalTime_z - ArrivalTime_o$$

As will be understood by those skilled in the art, some number of the initial sound waves within ultrasonic waves U produced by ultrasonic emitter 400 will be beneath a detection threshold of the receivers of ultrasonic receiver array 510. The number of undetected waves will change (increase or decrease) as ultrasonic emitter 400 moves (farther or closer) relative to ultrasonic receiver array 510. The number of undetected waves may also change if ultrasonic emitter 400 is not omnidirectional and ultrasonic emitter 400 is pointed on-axis or off-axis. Thus, waves within ultrasonic waves U may become detectable or undetectable between sequential emissions of ultrasonic emitter 400.

Figure 11:
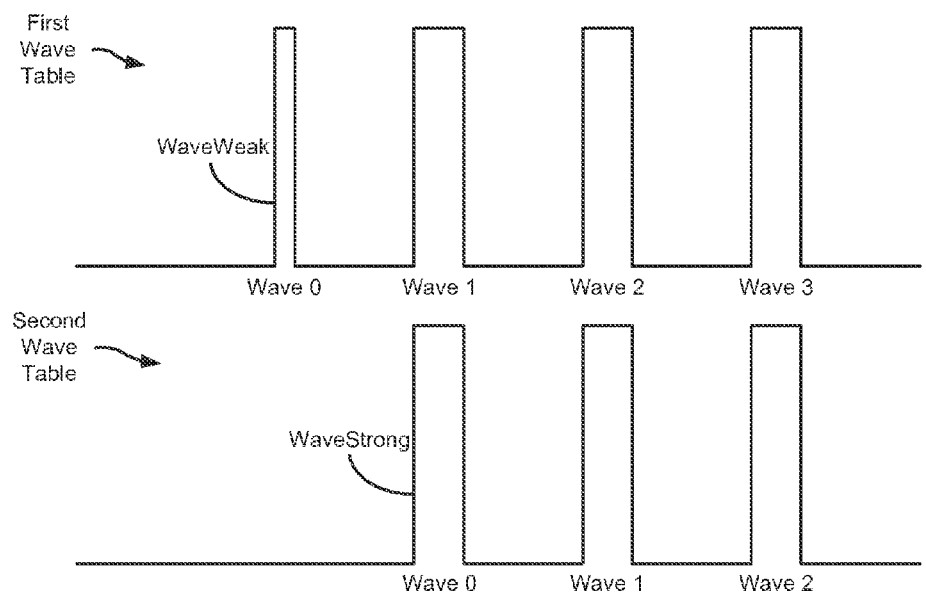
FIG. 11 illustrates output data of an ultrasonic receiver where a first detected wave of a first wave table is lost in a second wave table.

As may be seen in FIG. 11, a "lost" wave corresponds to an event where, e.g., due to movement of ultrasonic emitter 400 or a change in the orientation of ultrasonic emitter 400, a signal strength of a particular wave of ultrasonic waves U at a receiver of ultrasonic receiver array 510 decreases slightly between successive samples such that the particular wave is detected in a first sample and not detected in a second, subsequent sample. As may be seen in FIG. 12, a "gained" wave corresponds to an event where, e.g., due to movement of ultrasonic emitter 400 or a change in the orientation of ultrasonic emitter 400, a signal strength of the particular wave of ultrasonic waves U at the receiver of ultrasonic receiver array 510 increases slightly between successive samples such that the particular wave is not detected in the first sample and is detected in the second, subsequent sample. As described in greater detail below, tracking controller 500 detects, e.g., and accounts for, "lost" waves and "gained" waves utilizing multiple tests or algorithms. The tests may be used together or separately to detect lost waves and gained waves.

The first test detects and corrects for lost and gained waves using a strength of the first wave in each wave table 530 for successive ultrasonic waves U. As the strength increases, the waveform spends more time above the detection threshold of the associated receiver of ultrasonic receiver array 510 and the value of (WaveEnd-WaveStart) increases. A value for WaveStrength may be calculated as a percentage of time the waveform spends above the detection threshold as a percentage of the wavelength, e.g., with the following:

$$WaveStrength = \frac{(WaveEnd - WaveStart)}{WaveLength} * 100$$

where WaveLength corresponds to the actual wave length of ultrasonic waves U. As an example, if ultrasonic wave U is a forty kilohertz ultrasonic wave. WaveLength will be 25 microseconds. Weaker waves may have a WaveStrength of around ten percent, and stronger waves may have a WaveStrength of between forty and forty-five percent.

Thus, two predetermined values may be established to convert or group WaveStrength into a one of three coded values (WaveCode) to define the first wave: WaveWeak, WaveMedium and WaveStrong tiers. In particular, a LostWaveWeakBreak value and a LostWaveStrongBreak value may be established in order to convert WaveStrength into one of the three coded values as follows:

| | | |
|---|---|---|
| Wavestrength < LostWaveWeakBreak | → | WaveWeak |
| Wavestrength ≥ LostWaveWeakBreak; and Wavestrength < LostWaveStrong Break | → | WaveMedium |
| Wavestrength ≥ LostWaveStrona Break | → | WaveStrong |

LostWaveWeakBreak and LostWaveStrongBreak may be any suitable values. For example, LostWaveWeakBreak may be fifteen percent and LostWaveStrongBreak may be thirty percent.

FIG. 11 illustrates output data of a receiver of ultrasonic receiver array 510 where a first detected wave of a first wave table is lost in a second wave table. FIG. 11 illustrates output data of a receiver of ultrasonic receiver array 510 where a first detected wave of a second wave table is gained from a first wave table. To detect the lost waves and gained waves, the WaveCode for each receiver of ultrasonic receiver array 510 is compared to the WaveCode recorded for the previous successful sample. As may be seen in FIG. 1, if the WaveCode for the previous sample is WaveWeak and the WaveCode for the current sample is WaveStrong then the weak wave has fallen below the detection threshold and disappeared from the current sample. Thus, the first wave of the wave table 530 is a "lost" wave. In turn, the time differential value for the associated receiver was calculated by looking one wave too deeply into wave table 530. Thus, the wave that would appear as wave 10 in the previous sample appears as wave 9 since the first wave was "lost." The WaveOffset for the associated receiver is decremented so that it points at the wave in wave table 530 that would have arrived at had this wave not been "lost." Thus, a first detected wave of the current sample is established as a "lost" wave if the strength of the first detected wave of the previous sample is substantially less (e.g., at least ten percent less, at least twenty percent less or at least thirty percent less) than the strength of the first detected wave of the current sample.

Figure 12:
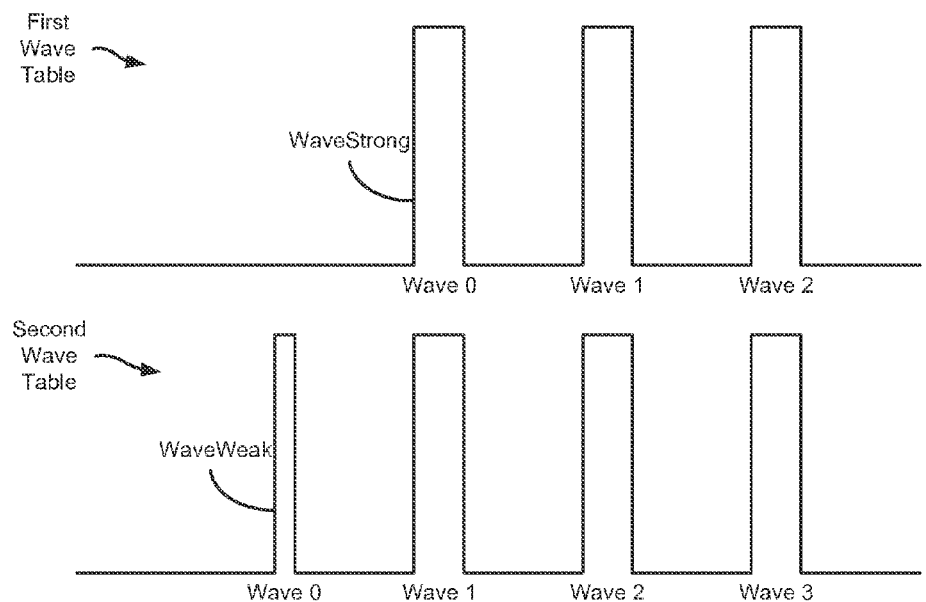
FIG. 12 illustrates output data of an ultrasonic receiver where a first detected wave of a second wave table is gained from a first wave table.

As may be seen in FIG. 12, if the WaveCode for the previous sample is WaveStrong and the WaveCode for the current sample is WaveWeak then a wave that was previously below the detection threshold in the previous sample is stronger in the current sample and has now been detected. Thus, the first wave of the wave table 530 is a "gained" wave. In turn, the time differential value for the associated receiver was calculated by looking one wave too soon into wave table 530. The WaveOffset for the associated receiver is incremented so that it points at the wave in the table that would have been arrived at had this wave not been "gained." Thus, a first detected wave of the current sample is established as a "gained" wave if the strength of the first detected wave of the previous sample is substantially greater (e.g., at least ten percent greater, at least twenty percent greater or at least thirty percent greater) than the strength of the first detected wave of the current sample.

A LostWaves value is recorded for each receiver of ultrasonic receiver array 510. If the WaveOffset was increased or decreased in this test then the LostWaves value for the associated receiver is updated. The LostWaves value is carried into the next sample and used to set the WaveOffset used for this next sample. This way if a wave is "lost" or "gained" in one sample and the next series of samples have "lost" or "gained" the same number of waves recognition of the "lost" or "gained" status is carried forward into later samples.

If a "lost" wave is "gained" back again or vice versa this will be detected by the same test. The update made to LostWaves will be reversed. The net result of this is that the leading wave may appear and disappear from wave table 530 due to the signal strength changing with movement of ultrasonic emitter 400 but calculated (x,y,z) location values will not bounce around.

The distance ultrasonic emitter 400 has moved from the previous sample to the current sample is calculated for each of three axes. If movement in any of the three axes exceeds a MaxLostWaveMovement value then ultrasonic emitter 400 is moving quickly. Thus, the appearance of WaveWeak or WaveStrong codes may not be indicating a "lost" or "gained" wave and updating LostWaves and WaveOffset would only corrupt the final values. If ultrasonic emitter 400 has moved farther than MaxLostWaveMovement then the values for LostWaves for all receivers of ultrasonic receiver array 510 are set to zero and WaveOffset values for all receivers of ultrasonic receiver array 510 are restored to their original values before the test was executed. MaxLostWaveMovement may be any suitable distance. For example, MaxLostWaveMovement may be twice the wavelength of ultrasonic waves U.

As the LostWaves counts are adjusted it is possible for the LostWaves value on one or more of the receivers of ultrasonic receiver array 510 to be set to values where the resulting WaveOffset would be less than zero and would point to a nonexistent wave. In such cases, the LostWaves value on all receivers of ultrasonic receiver array 510 are incremented until the WaveOffset value for all receivers of ultrasonic receiver array 510 point to an existing wave in their respective wave tables 530.

If the LostWaves or WaveOffset values have changed during this test then all ArrivalTime$_o$, ArrivalTime$_x$, ArrivalTime$_y$, and ArrivalTime$_z$ are recalculated using the new wave offset values. $T_a$, $T_b$ and $T_c$ are then recalculated using the new ArrivalTime$_o$, ArrivalTime$_x$, ArrivalTime$_y$, and ArrivalTime$_z$ values.

The second test detects and corrects for lost and gained waves using difference in time differentials between a current sample and a previous successful sample. If a first wave of the previous successful sample has been "lost," e.g., due to the strength of the first detected wave of the current sample being greater than the strength of the first detected wave of the previous successful sample, then the time differential (described above) for the associated receiver may increase, e.g., by about a time of one wavelength. Conversely, if the first wave of the previous successful sample has been "gained," e.g., due to the strength of the first detected wave of the current sample being less than the strength of the first detected wave of the previous successful sample, then the time differential for the associated receiver may decrease, e.g., by about a time of one wavelength.

In the second test, the values of $T_a$, $T_b$ and $T_c$ for the current sample are compared to The values of $T_a$, $T_b$ and $T_c$ for the previous successful sample. If a wave was "lost" or "gained" for one receiver of ultrasonic receiver array 510, the difference in time differentials between the current sample and the previous successful sample may be either greater than or less than the current sample by a single wavelength, e.g., within a tolerance level of LostWaveTolerance. In such cases, the time differential values for the other receivers of ultrasonic receiver array 510 may match those from the previous successful sample, e.g., within LostWaveTolerance. Since $T_a$, $T_b$ and $T_c$ were all derived in reference to the ArrivalTime for reference receiver 518 if a wave was "lost" or "gained" by reference receiver 518, all three values for $T_a$, $T_b$ and $T_c$ will all be greater than or all be less than their previous samples by a single wavelength, e.g., within LostWaveTolerance.

LostWaveTolerance may be any suitable percentage. For example, LostWaveTolerance may be selected to account for ultrasonic emitter 400 movement and instrumentation errors. As a particular example, LostWaveTolerance may be about ten percent.

Figure 13:
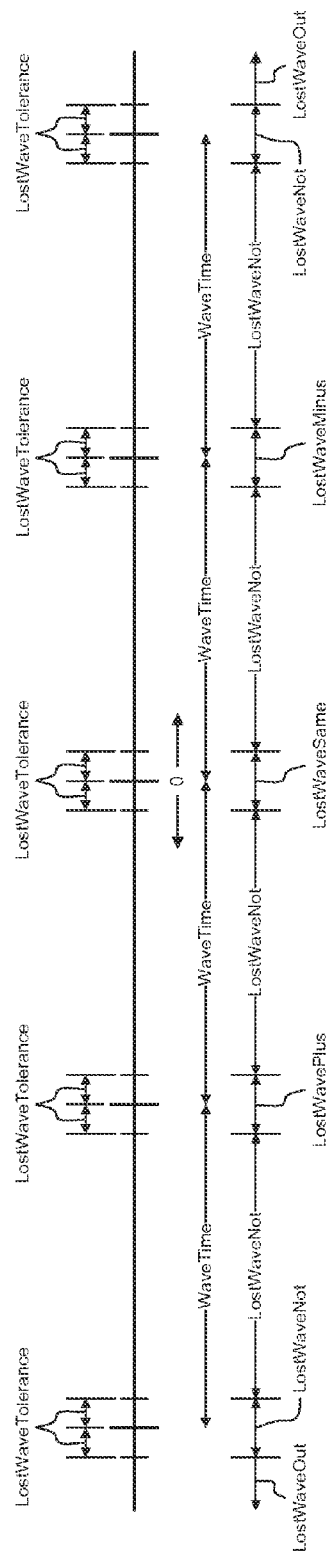
FIG. 13 illustrates a method for coding a difference between time differentials of two samples according to an exemplary embodiment of the present subject matter.

FIG. 13 illustrates a method for coding a difference between time differentials of two samples according to an exemplary embodiment of the present subject matter. As may be seen in FIG. 13, a code is determined or established for each of the $T_a$, $T_b$ and $T_c$ values based on the difference between the value in the current sample and the associated value in the last successful sample. WaveTime corresponds to a period of a single transmitted wave of ultrasonic waves U, e.g., 25 microseconds for a forty kilohertz ultrasonic signal. Possible codes include:

1. LostWaveSame—$T_n$ value within current sample is within LostWaveTolerance of the $T_n$ value in the previous sample.
2. LostWavePlus—current $T_n$ value+WaveTime is within LostWaveTolerance of the T value in the previous sample.
3. LostWaveMinus—current $T_n$ value—WaveTime is within LostWaveTolerance of the $T_n$ value in the previous sample.
4. LostWaveNot—the current $T_n$ value and the previous $T_n$ value did not produce a match for any of the previous codes and the current $T_n$ value is within (2*WaveTime) of the previous sample (ultrasonic emitter 400 may be moving slowly relative to the associated receiver).
5. LostWaveOut: the current $T_n$ value and the previous $T_n$ value did not produce a match for any of the above codes, e.g., because ultrasonic emitter 400 has moved more than two wavelengths relative to the associated receiver.

With the codes determined for each time deferential value, the following tests are applied to the codes derived for the $T_a$, $T_b$ and $T_c$ values:

1. All three values return LostWaveSame: ultrasonic emitter 400 has not moved and there are no "lost" or "gained" waves.
2. All three values return LostWavePlus: ultrasonic emitter 400 has not moved significantly and all three values $T_a$, $T_b$ and $T_c$ appear to have "gained" a wave then reference receiver 518 has "lost" a wave and LostWaves for reference receiver 518 is incremented.
3. All three values return LostWaveMinus: ultrasonic emitter 400 has not moved significantly and all three values $T_a$, $T_b$ and $T_c$ appear to have "lost" a wave then reference receiver 518 has "gained" a wave and LostWaves for reference receiver 518 is decremented.
4. Two values return LostWaveSame and one returns LostWavePlus: The transmitter has not moved significantly and one receiver has "Lost" a wave, the LostWaves value for the one receiver that produced the LostWavePlus code is incremented.
5. Two values return LostWaveSame and one returns LostWaveMinus: ultrasonic emitter 400 has not moved significantly and one receiver has "gained" a wave, the LostWaves value for the one receiver that produced the LostWaveMinus code is decremented.
6. Any of the values return LostWaveOut: ultrasonic emitter 400 is moving quickly and the "Lost" wave correction algorithm is no longer applicable and the LostWaves values for all receivers of ultrasonic receiver array 510 are set to zero.
7. Anything else: ultrasonic emitter 400 is moving slowly but the differences between current values of $T_a$, $T_b$ and $T_c$ do not indicate any "lost" waves.

The LostWaves values for all receivers of ultrasonic receiver array 510 carry over to a subsequent sample. The LostWaves values are cleared when a LostWaveOut code is returned. As the LostWaves counts are adjusted, the LostWaves value for one or move receivers of ultrasonic receiver array 510 may be set to values where the resulting WaveOffset would be less than zero and would point to a nonexistent wave. In such cases, the LostWaves value on all receivers of ultrasonic receiver array 510 is incremented until the WaveOffset value for all receivers of ultrasonic receiver array 510 point to an existing wave in the associated wave table 530. As an example, the LostWaves values may be gradually reduced or tapered off over a period of time, e.g., one or second seconds. Thus, for each sample over period of time, a fraction of the LostWaves values may be removed until the LostWaves values get to zero. In such a manner, the lost LostWaves values may be reset with a negligible velocity increase due to the reset.

If the LostWaves or WaveOffset values have changed during this test then all ArrivalTime$_o$, ArrivalTime$_x$, ArrivalTime$_y$ and ArrivalTime$_z$ are recalculated using the new wave offset values. $T_a$, $T_b$ and $T_c$ are then recalculated using the new ArrivalTime$_o$, ArrivalTime$_x$, ArrivalTime$_y$ and ArrivalTime$_z$ values.

Detecting and accounting for lost and gained waves can assist with limiting or preventing bounce or chatter within measurements of the location of ultrasonic emitter 400 relative to ultrasonic receiver array 510. Thus, the location of ultrasonic emitter 400 relative to ultrasonic receiver array 510 may be established or calculated more accurately and precisely, e.g., despite weak waves at the beginning of wave table 530 appearing and disappearing below the detection threshold of receivers of ultrasonic receiver array 510 between samples.

Figure 14:
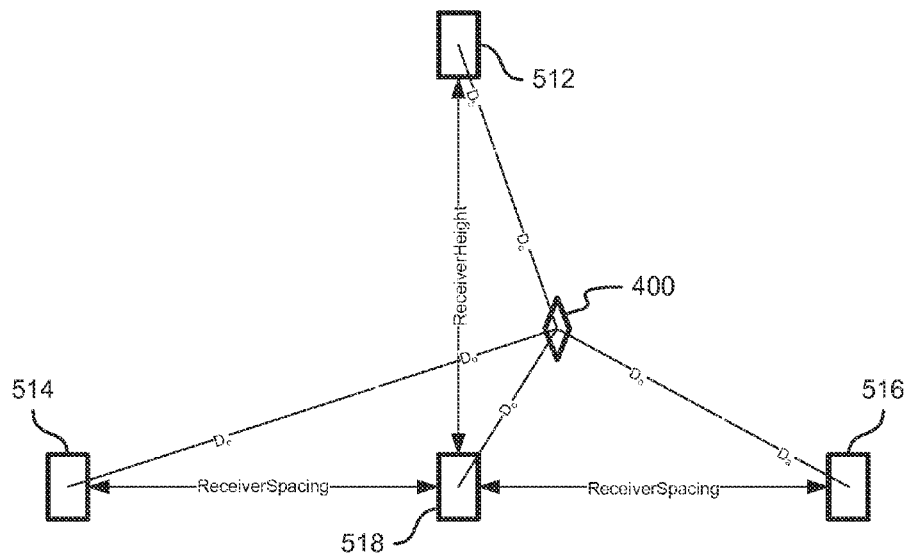
FIG. 14 provides a schematic view of the exemplary ultrasonic receiver array of FIG. 9 and the ultrasonic emitter of FIG. 7 in a first arrangement.

FIG. 14 provides a schematic view of ultrasonic receiver array 510 and the ultrasonic emitter 400 in a first arrangement. With $T_a$, $T_b$ and $T_c$ suitably determined, tracking controller 500 determines or calculates the location (x,y,z) of ultrasonic emitter 400. Given the velocity of sound, the time values can be converted into distance values $D_a$, $D_b$ and $D_c$ where $D_a$, $D_b$ and $D_c$ correspond to the distance differentials of the distance from ultrasonic emitter 400 to third receiver 516, first receiver 512 and second receiver 514, respectively, relative to the distance from ultrasonic emitter 400 to reference receiver 518. In particular, the receivers of ultrasonic receiver array 510 are placed such that the distances from reference receiver 518 to second receiver 514 and from reference receiver 518 to third receiver 516, RecieverSpacing, are equal. The height of first receiver 512 may be different than ReceiverSpacing so it has a separate measurement, ReceiverHeight.

$D_o$ is the distance from ultrasonic emitter 400 to reference receiver 518. Thus, the distances from ultrasonic emitter 400 to the other receivers of ultrasonic receiver array 510 may be expressed using $D_o$, $D_a$, $D_b$ and $D_c$ as follows:

$$DistanceR_o = D_o$$

$$DistanceR_x = D_o + D_a$$

$$DistanceR_y = D_o + D_b$$

$$DistanceR_z = D_o + D_c$$

For convenience ReceiverSpacing may be considered a unit of 1 so that the distance from reference receiver 518 to third receiver 516 and the distance from reference receiver 518 to second receiver 514 are both considered to be 1. Thus, the height of first receiver 512 is (ReceiverHeight/ReceiverSpacing) and will be called "K."

Such convention will render the (x,y,z) location of the transmitter in terms of ReceiverSpacing and can be converted back into units of length after calculation. The coordinate system is defined so that: $R_o$ is the (0,0,0) origin point; the x axis runs left to right with positive x values on the right; the y axis runs vertically with positive y values upward; and the z axis runs from reference receiver 518 perpendicular to both the x and y axes. Using such coordinate system, the locations of the four receivers may be given as:

$$R_0 = (0,0,0)$$

$$R_1 = (0,K,0)$$

$$R_2 = (-1,0,0)$$

$$R_3 = (1,0,0)$$

Thus, the following identities may be set up:

$$D_o^2 = x^2 + y^2 + z^2$$

$$(D_o + D_a)^2 = (x-1)^2 + y^2 + z^2$$

$$(D_o + D_b)^2 = x^2 + (y-K)^2 + z^2$$

$$(D_o + D_c)^2 = (x+1)^2 + y^2 + z^2$$

Where $D_o$, x, y, and z are unknown. $D_o$ can be solved for resulting in:

$$D_o = \frac{2 - D_a^2 - D_c^2}{2(D_a + D_c)}$$

With $D_o$ established, values for x and y may be derived as follows:

$$x = \frac{1 - (2 * D_o * D_a) - D_a^2}{2}$$

$$y = \frac{K^2 - (2 * D_o * D_b) - D_b^2}{2 * K}$$

With x, y and $D_o$, z may be established with the following:

$$z = \sqrt{D_o^2 + x^2 + y^2}$$

Multiplying x, y and z by ReceiverSpacing returns them to suitable units. Tracking controller 500 keeps a time stamp (e.g., via the internal counter) when ultrasonic waves U for the current (x,y,z) location as well as a time stamp for the previous successful sample. This allows calculation of the velocity of ultrasonic emitter 400 in all three axes and a NetVelocity, e.g., as follows:

$$xVelocity = \frac{x - xPrevious}{CurrentTimeStamp - \text{Previous Time Stamp}}$$

$$yVelocity = \frac{y - yPrevious}{CurrentTimeStamp - \text{Previous Time Stamp}}$$

$$zVelocity = \frac{z - zPrevious}{CurrentTimeStamp - \text{Previous Time Stamp}}$$

$$NetVelocity = \sqrt{xVelocity^2 + yVelocity^2 + zVelocity^2}$$

Given the velocities, accelerations may also be calculated, e.g., as follows:

$$xAcell = \frac{xVelocity - xPreviousVelocity}{CurrentTimeStamp - \text{Previous Time Stamp}}$$

$$yAcell = \frac{yVelocity - yPreviousVelocity}{CurrentTimeStamp - \text{Previous Time Stamp}}$$

$$zAcell = \frac{zVelocity - zPreviousVelocity}{CurrentTimeStamp - \text{Previous Time Stamp}}$$

$$NetAcell = \sqrt{xAcell^2 + yAcell^2 + zAcell^2}$$

Using the equations outlined above, the location, velocity and acceleration of ultrasonic emitter 400 may be determined, e.g., with or by tracking controller 500. While described above in reference to the arrangement show in FIG. 14, it should be understood that the receivers of ultrasonic receiver array 510 may be positioned in any other suitable arrangement in alternative exemplary embodiments with associated changes to the locating equations described above.

Figure 15:
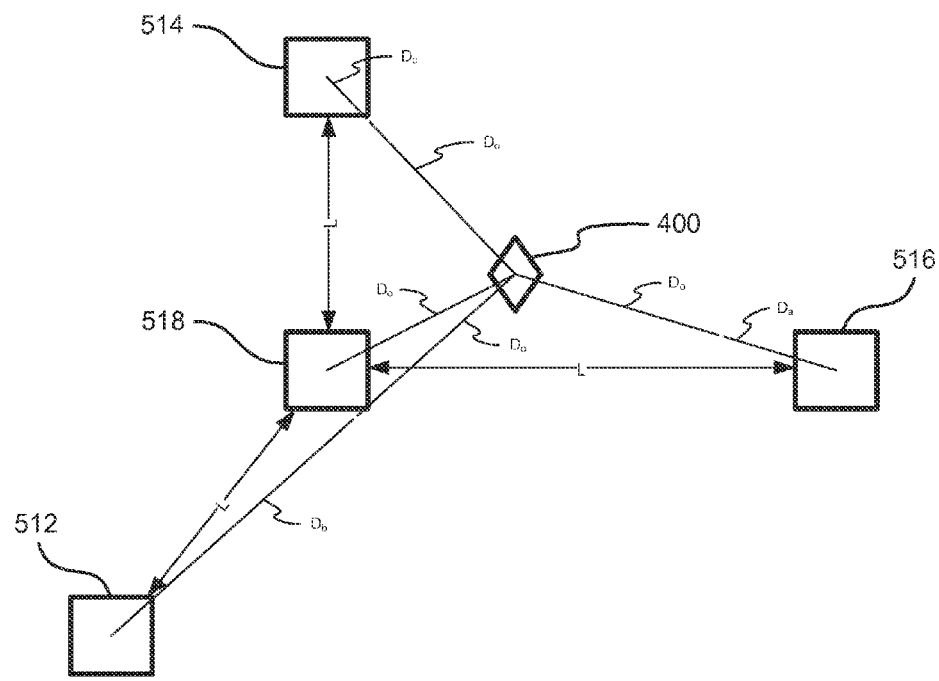
FIG. 15 provides a schematic view of the exemplary ultrasonic receiver array of FIG. 9 and the ultrasonic emitter of FIG. 7 in a second arrangement.

For example, FIG. 15 provides a schematic view of ultrasonic receiver array 510 and the ultrasonic emitter 400 in a second arrangement. The second arrangement of ultrasonic receiver array 510 may also be suitable for radio emitters. As may be seen in FIG. 15, reference receiver 518, first receiver 512, second receiver 514 and third receiver 516 may be disposed in an orthogonal arrangement with reference receiver 518 positioned at an origin of the orthogonal system and the first, second and third receivers 512, 514, 516 positioned at or on a respective one of the x,y,z axes. In particular, the first, second and third receivers 512, 514, 516 may be positioned a distance L along the respective one of the x,y,z axes such that the first, second and third receivers 512, 514, 516 are positioned equidistant from the reference receiver 518. The distance L may be any suitable length.

In the second arrangement, the following temporary values may be calculated to assist with determining the location (x,y,z) of ultrasonic emitter 400:

$$a = 1 - D_a^2$$

$$b = 1 - D_b^2$$

$$c = 1 - D_c^2$$

Thus, the following identities may be set up:

$$d = 1 - D_a^2 - D_b^2 - D_c^2$$

$$e = aD_a + bD_b + cD_c$$

$$f = \frac{-(a^2 + b^2 + c^2)}{4}$$

$$g = e^2 - 4df$$

Where $D_o$, x, y, and z are unknown, $D_o$ can be solved for resulting in:

$$D_o = \frac{-e + \sqrt{g}}{2d}$$

With $D_o$ established, values for x, y and z may be derived as follows:

$$x = \frac{1 - 2D_o D_a - D_a^2}{2}$$

$$y = \frac{1 - 2D_o D_b - D_b^2}{2}$$

$$z = \frac{1 - 2D_o D_c - D_c^2}{2}$$

The velocities and accelerations may also be calculated using the same equations described above for the first arrangement (FIG. 14).

Whatever the arrangement of ultrasonic receiver array 510, the distance and direction from ultrasonic emitter 400 to the various receivers of ultrasonic receiver array 510 changes as ultrasonic emitter 400 is moved relative to the receivers of ultrasonic receiver array 510. Thus, the signal strength of ultrasonic wave U at the receivers of ultrasonic receiver array 510 may also change. As discussed above, ultrasonic receiver 460 includes potentiometer 474 that allows the tracking controller 500 to adjust the sensitivity of ultrasonic receiver 460 by adjusting the gain of the amplifier chain. The sensitivity of each receiver of ultrasonic receiver array 510 may be adjusted independently, e.g., utilizing respective potentiometers.

A TargetWaveNumber within wave table 530 may be selected, e.g., predetermined. TargetWaveNumber may be any suitable number. For example, TargetWaveNumber may be ten. WaveStrength of TargetWaveNumber may be established with the following:

$$WaveStrength = \frac{(WaveEnd_{TargetWaveNumber} - WaveStart_{TargetWaveNumber})}{WaveLength} * 100$$

Two settings may also be defined, a TargetLowWaveStrength and a TargetHighWaveStrength. TargetLowWaveStrength and TargetHighWaveStrength may be any suitable percentages. For example, TargetLowWaveStrength may be forty-three percent, and TargetHighWaveStrength may be forty-five percent. If the WaveStrength for a receiver of ultrasonic receiver array 510 is below TargetLowWaveStrength, the gain on such receiver is increased, e.g., by one graduation of potentiometer 474. If the WaveStrength is above TargetHighWaveStrength, the gain for such receiver is reduced, e.g., by one graduation of potentiometer 474.

If ultrasonic emitter 400 was found to be moving slowly during the tests described above and tracking controller 500 is monitoring for and correcting for "lost" and "gained" waves, gain checking and adjusting may not be performed, e.g., due to such increases potentially being erroneously interpreted as a "lost" or "gained" wave.

It should be understood that $T_a$, $T_b$ and $T_c$ may be calculated in any other suitable manner in alternative exemplary embodiments. For example, rather than relying upon time stamps and wave table 530, phase differences between signals at each receiver of ultrasonic receiver array 510 may be used to establish $T_a$, $T_b$ and $T_a$, as discussed in greater detail below. Utilizing phase differences to establish $T_a$, $T_b$ and $T_c$ may be useful with radio waves having relatively long wavelengths, e.g., of about five meters. In such arrangements, if a radio frequency (RF) transmitter is positioned equidistant from two receivers, the received signals at each receiver would be identical. As the RF transmitter moves such that the RF transmitter is positioned farther from one receiver than the other receiver, the difference in relative positions delays reception of the signal at the more remotely positioned receiver relative to the more closely positioned receiver. Thus, the received signal at the two receivers will be out of phase in a manner that is proportional to the distance differential between the RF transmitter and the two receivers.

Thus, tracking controller 500, system 100, etc. may include a phase comparator circuit that evaluates phase differences between signals received from an emitter at each receiver of a receiver array. In particular, the phase comparator circuit may establish or measure the following phase differences between a reference receiver and the remaining receivers in the receiver array:

$$P_a = Phase_x - Phase_o$$

$$P_b = Phase_y - Phase_o$$

$$P_c = Phase_z - Phase_o$$

If this distance between the receivers in the receiver array is less than a wavelength of the signal from the emitter, the phase difference measured from the reference receiver and any of the receivers in the receiver array will be less than three hundred and sixty degrees. Because the amplitude of an RF signal is proportional to a sine wave as a function of time, the phase differentials may be used to determine $T_a$, $T_b$ and $T_c$, as will be understood by those skilled in the art. For example, $T_a$, $T_b$ and $T_c$ may be directly correlated to the phase differentials due to the proportionality the amplitude of an RF signal.

The accuracy of the phase comparator circuit may be some fraction of the wavelength of the signal from the emitter. Thus, the accuracy of the time differentials increases with the frequency of the signal. To increase an accuracy of a location calculation, a shorter wavelength RF signal may be sent or emitted, e.g., simultaneously with the longer wavelength RF signal. For example, a five gigahertz RF signal may be emitted in addition to a six megahertz RF signal, e.g., such that the six megahertz RF signal is AM modulated over the five gigahertz RF signal.

Utilizing the longer wavelength RF signal, the general location of the RF emitter may be established or determined. A more accurate and precise location of the RF emitter may be established or determined with the shorter wavelength RF signal, e.g., due the longer wavelength signal enabling an accurate determination of the number of whole wavelengths within the calculated phase differentials.

This written description uses examples to disclose the present subject matter, including the best mode, and also to enable any person skilled in the art to practice the present subject matter, including making and using any devices or systems and performing any incorporated methods. The patentable scope of the present subject matter is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for correcting errors when determining a position of an emitter relative to a receiver, the method comprising:
    emitting a first signal at the emitter;
    receiving the first signal at the receiver;
    determining a strength of a first detected wave of the first signal;
    emitting a second signal at the emitter;
    receiving the second signal at the receiver;
    determining a strength of a first detected wave of the second signal; and
    establishing whether the first detected wave of the second signal is a lost wave or a gained wave based at least in part on the strength of the first detected wave of the first signal and the strength of the first detected wave of the second signal,
    wherein the strength of the first detected wave of the first signal corresponds to a percentage of time that the first detected wave of the first signal spends above a detection threshold of the receiver as a percentage of a wavelength of the first signal,
    wherein the strength of the first detected wave of the second signal corresponds to a percentage of time that the first detected wave of the second signal spends above the detection threshold of the receiver as a percentage of a wavelength of the second signal.

2. The method of claim 1, wherein said step of establishing comprises comparing the strength of the first detected wave of the first signal to the strength of the first detected wave of the second signal.

3. The method of claim 2, wherein said step of establishing comprises:
    establishing the first detected wave of the second signal as the lost wave if the strength of the first detected wave of the first signal is substantially less than the strength of the first detected wave of the second signal; and
    establishing the first detected wave of the second signal as the gained wave if the strength of the first detected wave of the first signal is substantially greater than the strength of the first detected wave of the second signal.

4. The method of claim 1, wherein said steps of receiving the second signal at the receiver comprises populating a wave table, the wave table including a start time, an end time and a peak time for each wave of the second signal at the receiver.

5. The method of claim 4, further comprising:
    ascertaining a period for each wave of the second signal based at least in part on a difference between peak times of consecutive waves within the wave table; and
    comparing the period for each wave of the second signal to an expected period of the second signal in order to establish a first selected wave of the second signal.

6. The method of claim 5, further comprising:
    decrementing the first selected wave of the second signal to an adjacent wave within the wave table if the first detected wave of the second signal is the lost wave at said step of establishing; and
    incrementing the first selected wave of the second signal to an adjacent wave within the wave table if the first detected wave of the second signal is the gained wave at said step of establishing.

7. The method of claim 1, wherein the receiver comprises a plurality of receivers, the method further comprising repeating said steps of receiving the first signal, determining the strength of the first detected wave of the first signal, receiving the second signal, determining the strength of the first detected wave of the second signal and establishing whether the first detected wave of the second signal is the lost wave or the first detected wave of the second signal is the gained wave for each receiver of the plurality of receivers.

8. The method of claim 7, further comprising:
    determining an arrival time of the first signal at each receiver of the plurality of receivers;
    calculating a first set of time differentials, the first set of time differentials including time differentials between arrival times of the first signal at the plurality of receivers and the arrival time of the first signal at a reference receiver of the plurality of receivers;
    determining an arrival time of the second signal at each receiver of the plurality of receivers;
    calculating a second set of time differentials, the second set of time differentials including time differentials between arrival times of the second signal at the plurality of receivers and the arrival time of the second signal at the reference receiver of the plurality of receivers; and
    establishing whether the first detected wave of the second signal is the lost wave or the first detected wave of the second signal is the gained wave for each receiver of the plurality of receivers based at least in part on the first and second sets of time differentials.

9. The method of claim 1, wherein the emitter comprises an ultrasonic transducer or a radio emitter.

10. The method of claim 1, further comprising detecting no transmissions from the emitter with the receiver for at least a predetermined period of time prior to said step of emitting the first signal.

11. A method for correcting errors when determining a position of an emitter relative to a plurality of receivers, the method comprising:

emitting a first signal at the emitter;
determining an arrival time of the first signal at each receiver of the plurality of receivers;
calculating a first set of time differentials, the first set of time differentials including time differentials between arrival times of the first signal at the plurality of receivers and the arrival time of the first signal at a reference receiver of the plurality of receivers;
emitting a second signal at the emitter;
determining an arrival time of the second signal at each receiver of the plurality of receivers;
calculating a second set of time differentials, the second set of time differentials including time differentials between arrival times of the second signal at the plurality of receivers and the arrival time of the second signal at the reference receiver of the plurality of receivers; and
establishing whether a first detected wave of the second signal is a lost wave or a gained wave for each receiver of the plurality of receivers based at least in part on the first and second sets of time differentials, wherein said step of establishing comprises
  establishing the first detected wave of the second signal as the lost wave for one of the plurality of receivers if a difference between (1) the time differential of the arrival time of the first signal at the one of the plurality of receivers and the arrival time of the first signal at the reference receiver of the plurality of receivers and (2) the time differential of the arrival time of the second signal at the one of the plurality of receivers and the arrival time of the second signal at the reference receiver of the plurality of receivers is about equal to a positive magnitude of a period of the second signal; and
  establishing the first detected wave of the second signal as the gained wave for the one of the plurality of receivers if the difference between (1) the time differential of the arrival time of the first signal at the one of the plurality of receivers and the arrival time of the first signal at the reference receiver of the plurality of receivers and (2) the time differential of the arrival time of the second signal at the one of the plurality of receivers and the arrival time of the second signal at the reference receiver of the plurality of receivers is about equal to a negative magnitude of the period of the second signal.

12. The method of claim 11, further comprising populating a wave table for each receiver of the plurality of receivers, the wave table including a start time, an end time and a peak time for each wave of the second signal at the respective receiver of the plurality of receivers.

13. The method of claim 12, further comprising:
ascertaining a period of each wave of the second signal for each receiver of the plurality of receivers based at least in part on a difference between peak times of consecutive waves within the wave table; and
comparing the period for each wave of the second signal to an expected period of the second signal in order to establish a first selected wave of the second signal for each receiver of the plurality of receivers.

14. The method of claim 13, further comprising:
decrementing the first selected wave of the second signal to an adjacent wave within the wave table for each receiver of the plurality of receivers if the first selected wave of the second signal is the lost wave at said step of establishing; and
incrementing the first selected wave of the second signal to an adjacent wave within the wave table for each receiver of the plurality of receivers if the first selected wave of the second signal is the gained wave at said step of establishing.

15. The method of claim 11, wherein the plurality of receivers comprises at least four receivers.

16. The method of claim 11, wherein the emitter comprises an ultrasonic transducer or a radio emitter.

17. The method of claim 11, further comprising detecting no transmissions from the emitter with the plurality of receivers for at least a predetermined period of time prior to said step of emitting the first signal.

\* \* \* \* \*